United States Patent
Okuwaki et al.

(10) Patent No.: US 6,992,279 B2
(45) Date of Patent: Jan. 31, 2006

(54) METHOD FOR ADJUSTING A MULTI-BEAM SOURCE UNIT

(75) Inventors: Hiroyuki Okuwaki, Ohta-ku (JP); Osamu Kawazoe, Ohta-ku (JP); Yasuhiro Naoe, Ohta-ku (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 10/910,605

(22) Filed: Aug. 4, 2004

(65) Prior Publication Data

US 2005/0007781 A1 Jan. 13, 2005

Related U.S. Application Data

(62) Division of application No. 09/731,793, filed on Dec. 8, 2000, now Pat. No. 6,798,820.

(30) Foreign Application Priority Data

Dec. 8, 1999 (JP) .................................. 11-349145
Jul. 7, 2000 (JP) ............................ 2000-206535

(51) Int. Cl.
*H01J 3/14* (2006.01)
*H01S 3/08* (2006.01)
(52) U.S. Cl. ...................... 250/234; 362/259; 362/455; 372/107; 347/241
(58) Field of Classification Search ........ 250/234–237, 250/578.1; 347/233, 234, 238, 241, 256–258; 359/641, 648, 662; 362/259, 277, 285, 335, 362/455, 800; 372/107, 29.01, 29.014
See application file for complete search history.

(56) References Cited

U.S. PATENT DOCUMENTS

| | | | |
|---|---|---|---|
| 4,763,334 A * | 8/1988 | Shimada et al. | 372/29.014 |
| 5,131,002 A | 7/1992 | Mooradian | |
| 5,243,619 A | 9/1993 | Albers et al. | |
| 5,758,950 A | 6/1998 | Naoe et al. | |
| 5,997,153 A | 12/1999 | Naoe et al. | |
| 6,097,749 A * | 8/2000 | Naoe et al. | 372/103 |
| 6,179,445 B1 | 1/2001 | Naoe et al. | |
| 6,479,846 B2 * | 11/2002 | Tichauer | 257/219 |
| 6,687,283 B2 * | 2/2004 | Naoe | 372/107 |
| 6,771,300 B2 * | 8/2004 | Amada et al. | 347/241 |
| 2002/0012041 A1 * | 1/2002 | Mogi et al. | 347/238 |

* cited by examiner

*Primary Examiner*—Stephone B. Allen
(74) *Attorney, Agent, or Firm*—Oblon, Spivak, McClelland, Maier & Neustadt, P.C.

(57) ABSTRACT

A method for adjusting a multi-beam source unit including a multi-beam laser diode provided with light emitting points, and a collimator lens includes measuring a state of a position of the light emitting points with respect to a standard design line based on beam spots corresponding to the light emitting points on an image recording surface, and rotating the multi-beam laser diode about an optical axis of a scanning optical system to align the position of the light emitting points with the standard design line.

8 Claims, 29 Drawing Sheets

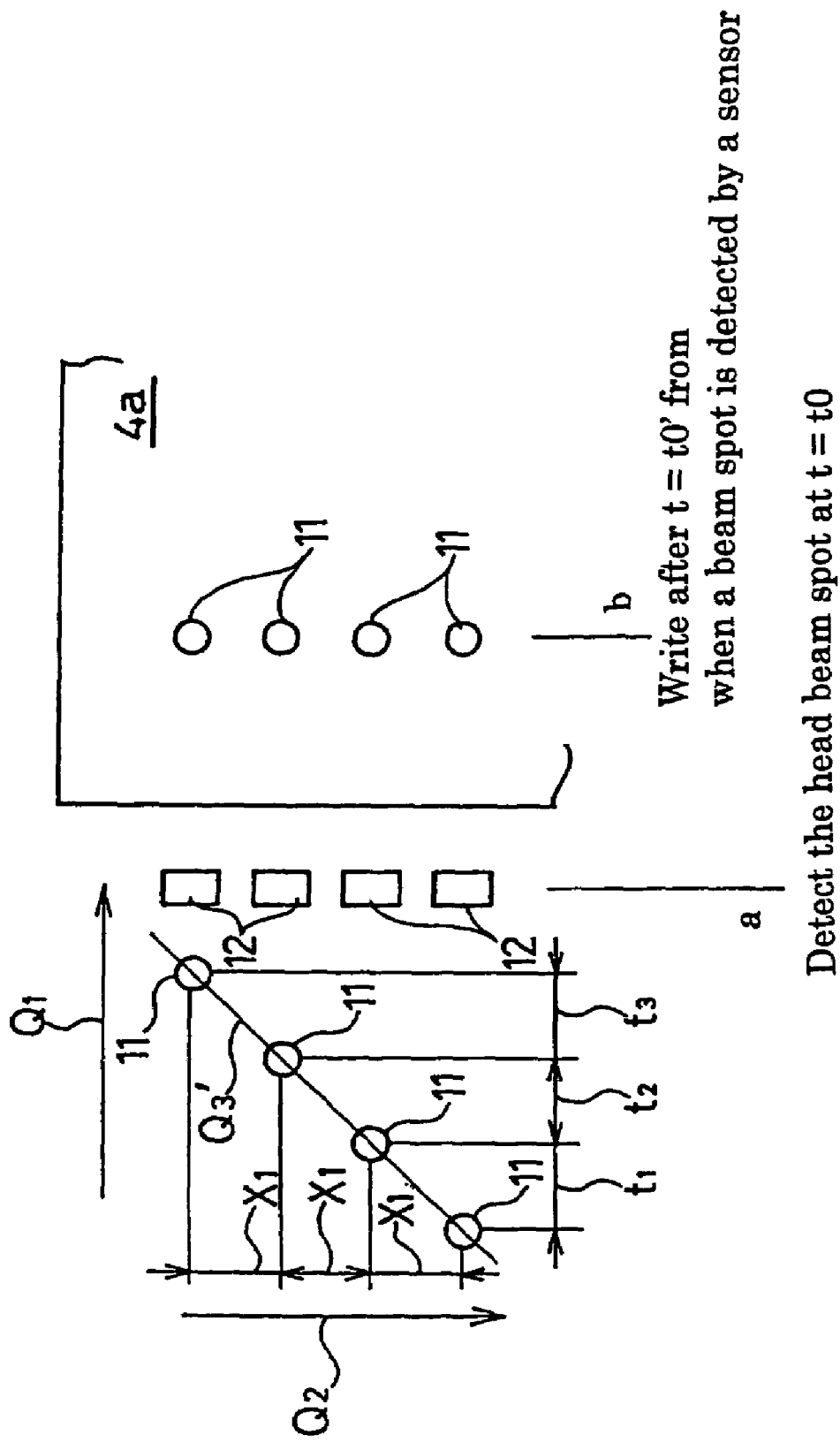

Detect the head beam spot 11 at t = t0

Number of beams

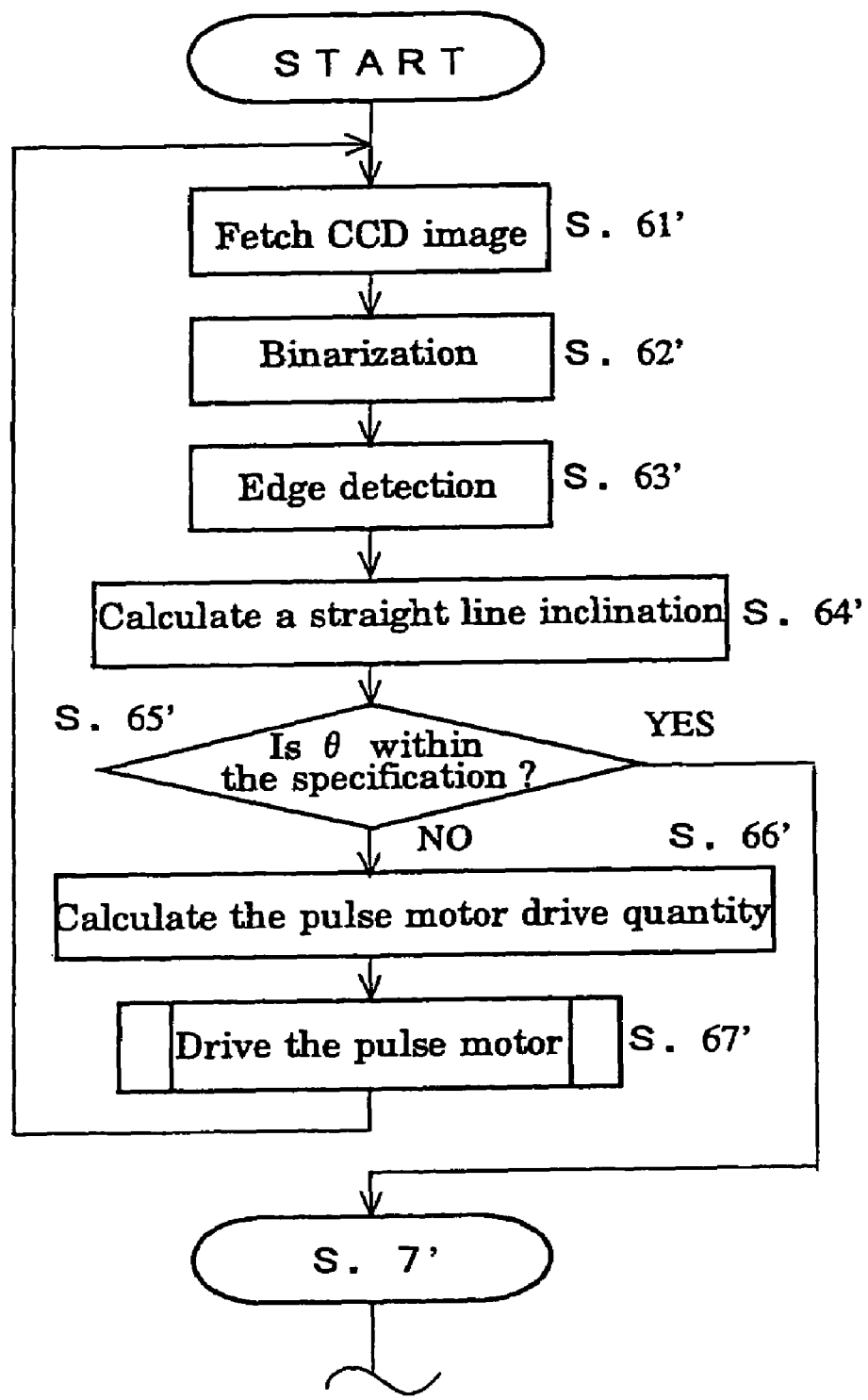

METHOD FOR ADJUSTING A MULTI-BEAM SOURCE UNIT

CROSS REFERENCE TO RELATED APPLICATIONS

This application is a divisional of U.S. Application Ser. No. 09/731,793 filed Dec. 8, 2000 now U.S. Pat. No. 6,798,820, and further is based upon and claims the benefit of priority from the prior Japanese Patent Application No. 11-349145, filed Dec. 8, 1999, and the prior Japanese Patent Application No. 2000-206535, filed Jul. 7, 2000, the entire contents of each of which are hereby incorporated herein by reference.

BACKGROUND OF THE INVENTION

1. Field of the Invention

The present invention relates to a method and device for adjusting a multi-beam source unit used in an image forming apparatus such as a digital copying machine or a laser printer, as well as a method for assembling the multi-beam source unit and an image forming apparatus using the multi-beam source unit.

2. Description of the Prior Art

Heretofore, as an image forming apparatus such as a digital copying machine or a laser printer there has been known an image forming apparatus with a laser scanning optical system mounted thereon. With the recent tendency to a higher write accuracy and a higher write speed, a laser scanning optical system using a multi-beam laser diode is becoming most popular.

FIG. 1 illustrates such a laser scanning optical system schematically. In the same figure, the reference numeral 1 denotes a multi-beam source unit, numeral 2 denotes a polygon mirror, numeral 3 denotes a fθ lens, and numeral 4 denotes a photosensitive member (also called an image recording medium). The multi-beam source unit 1 substantially comprises a multi-beam laser diode 5 and a collimator lens 6. The multi-beam laser diode 5 has a plurality of light emitting points to emit multi-laser beams P. The multi-laser beams P are collimated by means of the collimator lens 6, then are reflected by the polygon mirror 2 and are conducted onto a surface (also called an image recording surface) 4a of the photosensitive member 4.

The polygon mirror 2 and the fθ lens 3 constitute a part of a scanning optical system. On the surface 4a of the photosensitive member 4, as shown in FIG. 2, the multi-laser beams P are scanned in a horizontal direction Q1 while leaving predetermined pitches X1 in a vertical scanning direction Q2 which is perpendicular to the horizontal scanning direction Q1. In this type of a laser scanning optical system, the surface 4a of the photosensitive member 4 is scanned over a large number of lines at a time to write data onto the surface 4a.

As the write accuracy and speed have recently become higher, the laser scanning optical system is required to be improved in its accuracy for the diameter of a beam spot 11 of each multi-laser beam P, collimatability of the beams, a pitch X1 between adjacent beam spots 11 in the vertical scanning direction Q2, and a write start position in the horizontal scanning direction Q1. The accuracy required is becoming more and more strict as a higher image quality is required.

As shown in FIG. 3, the multi-beam laser diode 5 has a light emitting section 7 in the interior thereof. In the light emitting section 7 are provided a plurality of light emitting points, which are, for example, four light emitting points 7a to 7d. The light emitting points 7a to 7d are arranged on a designwise predetermined virtual straight line Q3 spacedly from one another. The virtual straight line Q3 is obtained by joining acute points 9a and 10a of a pair of acute-angled cutout portions 9 and 10 which are formed in a metallic stem 8 of the multi-beam laser diode 5.

In the conventional multi-beam laser diode 5, the light emitting points 7a to 7d are spaced widely from one another, so that when multi-laser beams are projected onto the surface 4a of the photosensitive member 4, the pitches X1 of their beam spots 11 in the vertical scanning direction Q2 become large and the image quality becomes coarse. For avoiding such an inconvenience, as shown in FIG. 4, the multi-beam laser diode 5 is turned around the optical axis of the scanning optical system (not shown) so that an arranged direction (straight line) Q3' of the beam spots 11 becomes oblique with respect to the horizontal scanning direction Q1 on the surface 4a of the photosensitive member 4, thereby adjusting the pitches X1 in the vertical scanning direction Q2 to enhance the write density (recording density) in the vertical scanning direction Q2 and improve the image quality.

However, if the multi-beam laser diode 5 is turned so that the arranged direction (straight line) Q3' of the beam spots 11 is deviated obliquely with respect to the vertical scanning direction Q2, to improve the write density, then in the case where the light emitting points 7a–7d are driven simultaneously to effect write, this results in that write start positions in the horizontal scanning direction Q1 of the beam spots 11 on the surface 4a of the photosensitive member 4 become displaced and hence the image quality is deteriorated.

In the laser scanning optical system of this type, for making the write start positions of the beam spots on the surface 4a of the photosensitive member 4 uniform, for example sensors 12 for detecting scan positions of the laser beams are arranged correspondingly to the laser beams and the emission of beam from each of the light emitting points 7a to 7d is controlled in accordance with a light receiving timing of each sensor 12.

More particularly, the emission of light from the light emitting points 7a–7d is controlled upon the lapse of time t0' after the detection of the head beam spot 11 at time t=t0, thereby making write start positions in the horizontal scanning direction Q1 on the surface 4a of the photosensitive member 4 uniform.

Moreover, instead of using sensors 12 correspondingly to the light emitting points 7a–7d a sensor 12 is provided correspondingly to the head beam spot 11 in the horizontal scanning direction Q1, as shown in FIG. 5(a), then time lags t1, t2, and t3 of beam spots 11 are determined in advance, and as shown in FIG. 5(b), after the head beam spot 11 has been detected by the sensor 12, the emission of beams from the remaining light emitting points 7b–7d is delayed correspondingly to the time lags by means of a delay control circuit (not shown), thereby making the beam spots 11 uniform in the vertical scanning direction at the write start positions on the surface 4a of the photosensitive member 4, as shown in FIG. 5(a).

In this laser scanning optical system, however, the control circuit used for aligning write start positions is complicated, with consequent increase of cost.

At present, a multi-beam laser diode 5 with light emitting points 7a–7d spaced more narrowly than before is being developed. In a multi-beam source unit having such a multi-beam laser diode 5 it is presumed that positional variations of the light emitting points 7a–7d will be small. Further, the multi-beam source unit is probably designed so as to be set to a scanning optical system on the assumption that light emitting points 7a–7d are arranged in the direction of a predetermined standard design line when they are present on the virtual straight line Q3 defined by a pair of cutout portions 9 and 10, and is attached as it is to a body portion of an image forming apparatus.

Even with such a design, however, due to errors in the manufacturing process of the multi-beam laser diode 5 being considered, it is rarely the case that the light emitting points 7a–7d are positioned on the virtual straight line Q3 without error. Even if there exists an arrangement direction (straight line) Q4 joining light emitting points 7a–7d, as shown in FIG. 6, the arrangement direction Q4 and the virtual straight line Q3 are slightly inclined with respect to each other and thus aligning the arrangement direction of the light emitting points 7a–7d with the direction of the standard design line without the need of any adjustment is difficult. The reference mark θ represents the angle of that inclination.

When the multi-beam laser diode 5 is to be mounted to a body portion of an image forming apparatus body with a scanning optical system mounted thereon, since there exists a mounting error, it is desirable to turn the multi-beam laser diode 5 around the optical axis so that the arrangement direction Q4 of the light emitting points is at a predetermined angle relative to the vertical scanning direction Q2.

SUMMARY OF THE INVENTION

The present invention has been accomplished in view of the above circumstances and it is an object of the invention to provide a multi-beam source unit adjusting method and device wherein an arranged direction of light emitting points of a multi-beam laser diode relative to a horizontal scanning direction of a scanning optical system can be aligned with a predetermined standard design line direction, as well as a method for assembling the multi-beam source unit and an image forming apparatus using the multi-beam source unit, particularly, a multi-beam source unit adjusting method and device wherein an arranged direction of light emitting points of a multi-beam laser diode can be adjusted to a vertical scanning direction of a scanning optical system easily without impairing a required design accuracy, as well as a method for assembling the multi-beam source unit and an image forming apparatus using the multi-beam source unit.

For achieving the above object, according to the present invention, in the first aspect thereof, there is provided a method for adjusting a multi-bean source unit, the multi-beam source unit including a multi-beam laser diode capable of emitting multi-laser beams from a plurality of light emitting points and a collimator lens for collimating the multi-laser beams, the multi-laser diode having a stem formed with a cutout portion, the multi-beam source unit being designed so as to be set to a scanning optical system on the assumption that the plural light emitting points are arranged in the direction of a predetermined standard design line when they are present on a virtual straight line defined by the said cutout portion, the method comprising measuring an arranged state of the light emitting points with respect to the standard design line on the basis of beam spots on an image surface corresponding to an image recording surface and rotating the multi-beam laser diode about an optical axis of the scanning optical system to align the arrangement direction of the light emitting points with the direction of the standard design line.

In the second aspect of the present invention there is provided, in combination with the above first aspect, a multi-beam source unit adjusting method wherein the virtual straight line is defined by a concave or convex portion as an engaging portion for positioning formed in the stem.

According to the above first and second aspects of the invention, since an arranged state of the light emitting points with respect to the standard design line is measured on the basis of beam spots on an image surface and the multi-beam laser diode is rotated for adjustment about the optical axis of the scanning optical system, the arrangement direction of the light emitting points can be aligned with the direction of the standard design line easily.

In the third aspect of the present invention there is provided, in combination with the above first or second aspect, a multi-beam source unit adjusting method wherein on the image surface corresponding to the image recording surface an arrangement direction of the light emitting points with respect to the standard design line is determined on the basis of a straight line obtained by joining two beam spots corresponding to two light emitting points located remotest from each other out of the light emitting points.

According to the multi-beam source unit adjusting method in the above third aspect of the invention, since an arrangement direction of the light emitting points is determined using only the light emitting points located remotest from each other, it is possible to determine a light emitting points arrangement direction of the multi-beam laser diode easily.

In the fourth aspect of the present invention there is provided, in combination with the above first or second aspect, a multi-beam source unit adjusting method wherein on the image surface corresponding to the image recording surface there are measured relative positions of beam spots corresponding to the light emitting points to determine an approximate straight line on which the light emitting points can be regarded as being present, and an arrangement direction of the light emitting points is determined by the approximate straight line.

In the fifth aspect of the present invention there is provided, in combination with the above fourth aspect, a multi-beam source unit adjusting method wherein the approximate straight line is obtained by a method of least squares.

In the sixth aspect of the present invention there is provided, in combination with the above first or second aspect, a multi-beam source unit adjusting method wherein, on the image surface corresponding to the image recording surface, relative positions in the horizontal scanning direction of beam spots corresponding to the light emitting points are measured in terms of relative angle positions with respect to the standard design line to determine a maximum deviation in the horizontal scanning direction among the beam spots, then the multi-beam laser diode is rotated to measure relative positions of the beam spots in the horizontal scanning direction at different relative angle positions, thereby determining a maximum deviation in the horizontal scanning direction among the beam spots, these operations are repeated to measure an arranged state of the light emitting points, and an arrangement direction of the light emitting points is determined by a relative angle position corresponding to the smallest maximum deviation.

According to the multi-beam source unit adjusting methods in the above fourth to sixth aspects of the invention, the arrangement direction of the multi-beam source unit can be aligned with the direction of the standard design line with a high accuracy.

In the seventh aspect of the present invention there is provided, in combination with the above first or second aspect, a multi-beam source unit adjusting method wherein the arrangement direction of the light emitting points is substantially parallel to the vertical scanning direction.

According to the multi-beam source unit adjusting method in the above seventh aspect of the invention, since the arrangement direction of the light emitting points can be aligned with the vertical scanning direction before mounting the same unit to a body portion of an image forming apparatus, it is possible to dispense with such an operation as adjusting the beam spot pitch in the vertical scanning direction after mounting the multi-beam source unit to the body portion of the image forming apparatus and it is not necessary to adopt a complicated construction such that for correcting write start positions displaced in the horizontal scanning direction due to the beam spot pitch adjustment, sensors for detecting laser beam scan positions are provided for laser beams respectively on the image forming apparatus body side and the write start position is controlled for each laser beam, nor is it necessary to adopt a complicated construction such that a time lag of each laser beam in the horizontal scanning direction is measured and a control is made for driving each laser beam with use of a delay circuit. Thus, it is possible to reduce the number of components used, shorten the assembling time required for mounting to the body portion of the image forming apparatus, and attain the reduction of cost. It is also possible to attain the simplification of control using software.

In the eighth aspect of the present invention there is provided, in combination with the first or second aspect, a multi-beam source unit adjusting method wherein the multi-beam source unit is provided with a base member, the base member supporting the multi-beam laser diode rotatably and having a fitting cylinder which defines a rotational center, the multi-beam source unit is also provided with a mounting bracket to be mounted to a body portion of an image forming apparatus, the mounting bracket having a horizontal scanning direction reference plane to be confronted with a horizontal scanning direction reference plane formed in the body portion of the image forming apparatus and also having a fitting hole to be fitted on the fitting cylinder, the multi-beam source unit is further provided with an engaging piece for engagement with an engaging portion for positioning and a pressing spring piece for pressing the stem, the engaging piece being brought into engagement with the engaging portion for positioning, and the base member being rotated while being supported by the mounting bracket to adjust the arrangement direction of the light emitting points substantially in parallel with the vertical scanning direction.

According to the multi-beam source unit adjusting method in the eighth aspect of the invention, since the multi-beam source unit can be adjusted alone before being mounted to the body portion of the image forming apparatus, it is possible to simplify the mounting work for mounting the multi-beam source unit to the image forming apparatus body.

In the ninth aspect of the present invention there is provided a multi-beam source unit adjusting device comprising a base member adapted to be positioned and fixed, the base member being provided with a multi-beam laser diode having a plurality of light emitting points and capable of emitting multi-laser beams and also provided with a collimator lens for collimating the multi-laser beams; an image pickup device on which the multi-laser beams are projected for measuring an arrangement direction of the light emitting points on the basis of beam spots and for rotating the multi-beam laser diode about an optical axis of an optical system; and a focusing lens disposed between the image pickup device and the collimator lens to condense and focus the multi-laser beams onto an image pickup surface of the image pickup device, wherein a front-side focal position of the focusing lens is substantially coincident with a rear-side focal position of the collimator lens.

According to the multi-beam source unit adjusting device in the ninth aspect of the invention, since the multi-laser beams from all the light emitting points can be enlarged, condensed and focused substantially onto the image pickup surface, the position of each beam spot can be detected with a high accuracy.

In the tenth aspect of the present invention there is provided, in combination with the above ninth aspect, a multi-beam source unit adjusting device wherein the image pickup device is a CCD camera and the focusing lens is disposed so that a focused area of a beam spot of each multi-laser beam on an image pickup surface of the CCD camera is ten times or more as large as a pixel area.

According to the multi-beam source unit adjusting device in the tenth aspect of the invention, the resolving performance on the image pickup surface can be improved and a central position of each beam spot can be calculated with a high accuracy.

In the eleventh aspect of the present invention there is provided, in combination with the above ninth aspect, a multi-beam source unit adjusting device wherein for controlling in such a manner as to give substantially equal respective outputs of the multi-laser beams there is provided a control circuit which controls luminous outputs of N number of light emitting points so that the sum total of outputs of the light emitting points is N times as large as a detected outputs of one of the laser beam from any one of the N number of light emitting points.

According to the multi-beam source unit adjusting device in the eleventh aspect, since it is possible to equalize the luminous outputs of the light emitting points, the beam spots on the image pickup surface can be made equal in size and it is possible to calculate a central position of each beam spot with a high accuracy.

In the twelfth aspect of the present invention there is provided, in combination with the above ninth aspect, a multi-beam source unit adjusting device wherein a central position of each of the beam spots is a centroid position of a CCD pixel output corresponding to the beam spot.

According to the multi-beam source unit adjusting device in the twelfth aspect of the invention, the center of each beam spot can be measured with a high accuracy.

In the thirteenth aspect of the present invention there is provided, in combination with the above twelfth aspect, a multi-beam source unit adjusting device wherein the centroid position of each of the beam spots is determined by subtracting 1/e of a maximum value of the CCD pixel output and performing calculation using a CCD pixel output larger than zero.

According to the multi-beam source unit adjusting device in the thirteenth aspect, the center of each beam spot can be determined with a high accuracy even if the beam spot is out of shape.

In the fourteenth aspect of the present invention there is provided a method for assembling a multi-beam source unit, the multi-beam source unit including a multi-beam laser diode capable of emitting multi-laser beams from a plurality of light emitting points, the multi-beam laser diode having a stem formed with a cutout portion, the multi-beam source unit also including a collimator lens for collimating the multi-laser beams, the multi-beam source unit being designed so as to be set to a scanning optical system on the assumption that the light emitting points are arranged in the direction of a predetermined standard design line when they are present on a virtual straight line defined by the said cutout portion, wherein an arranged state of the light emitting points with respect to the standard design line is measured on the basis of beam spots formed on an image surface corresponding to an image recording surface and the multi-beam laser diode is rotated about an optical axis of the scanning optical system to align the direction of arrangement of the light emitting points with the direction of the standard design line, the method comprising a fixing step of positioning the multi-beam laser diode to a base member, the base member supporting the multi-beam laser diode rotatably and having a fitting cylinder which defines a rotational center, and fixing the multi-beam laser diode with use of a pressing spring piece, a positioning step of positioning the collimator lens with respect to the multi-beam laser diode, a calculating step of measuring spot positions of the laser beams emitted from the multi-beam laser diode and calculating central positions thereof, and a rotation adjusting step of adjusting the rotation of the base member with the multi-beam laser diode attached thereto in such a manner that the direction of arrangement of the beam spots is aligned with the standard design line direction.

BRIEF DESCRIPTION OF THE DRAWINGS

FIG. 4 is an explanatory diagram for explaining an example of controlling write start positions on the image recording surface;

FIG. 31 is a flow chart explaining a detailed procedure of the adjusting process shown in FIG. 30;

DETAILED DESCRIPTION OF A PREFERRED EMBODIMENT

[Multi-Beam Source Unit and Method for Adjusting the Same According to an Embodiment of the Invention]

Figure 1:
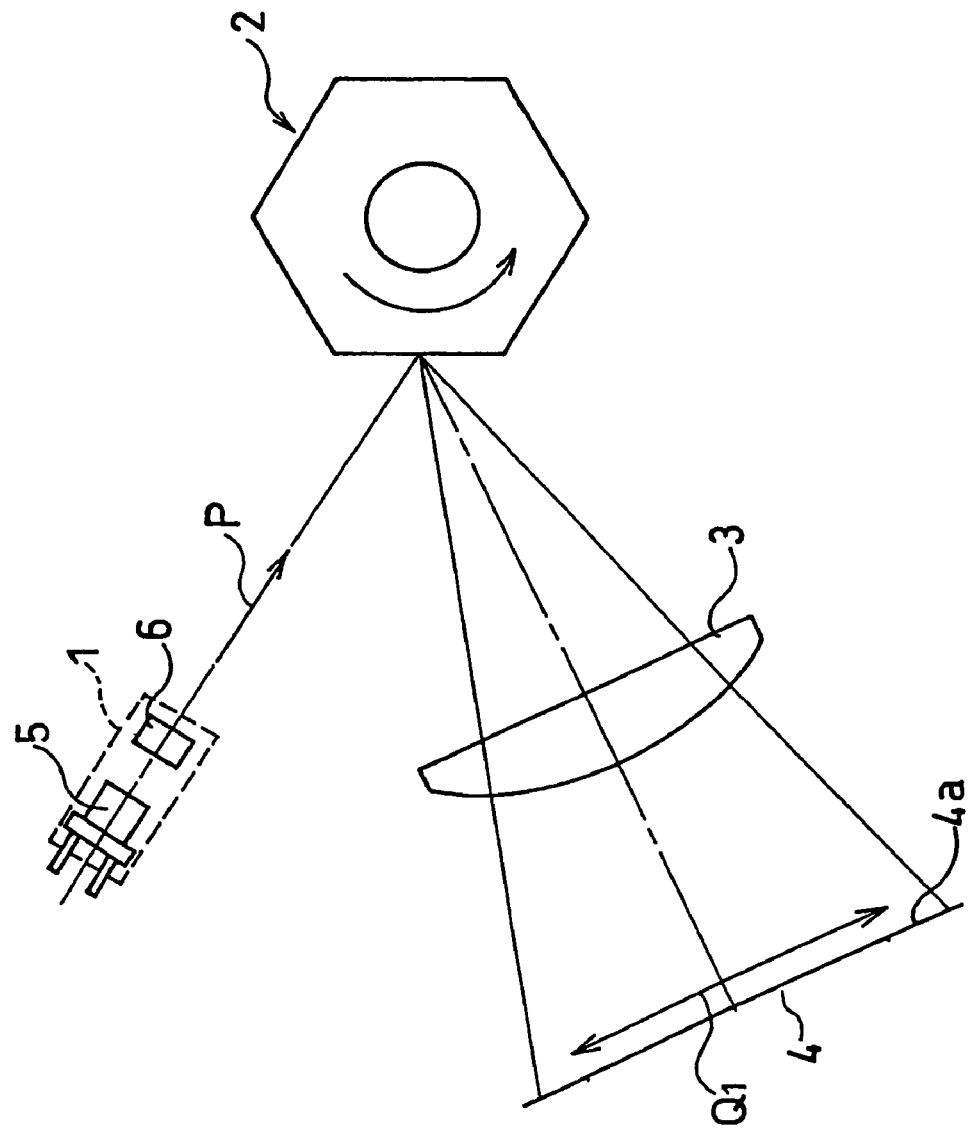
FIG. 1 is a schematic diagram showing the construction of a scanning optical system schematically.
Figure 2:
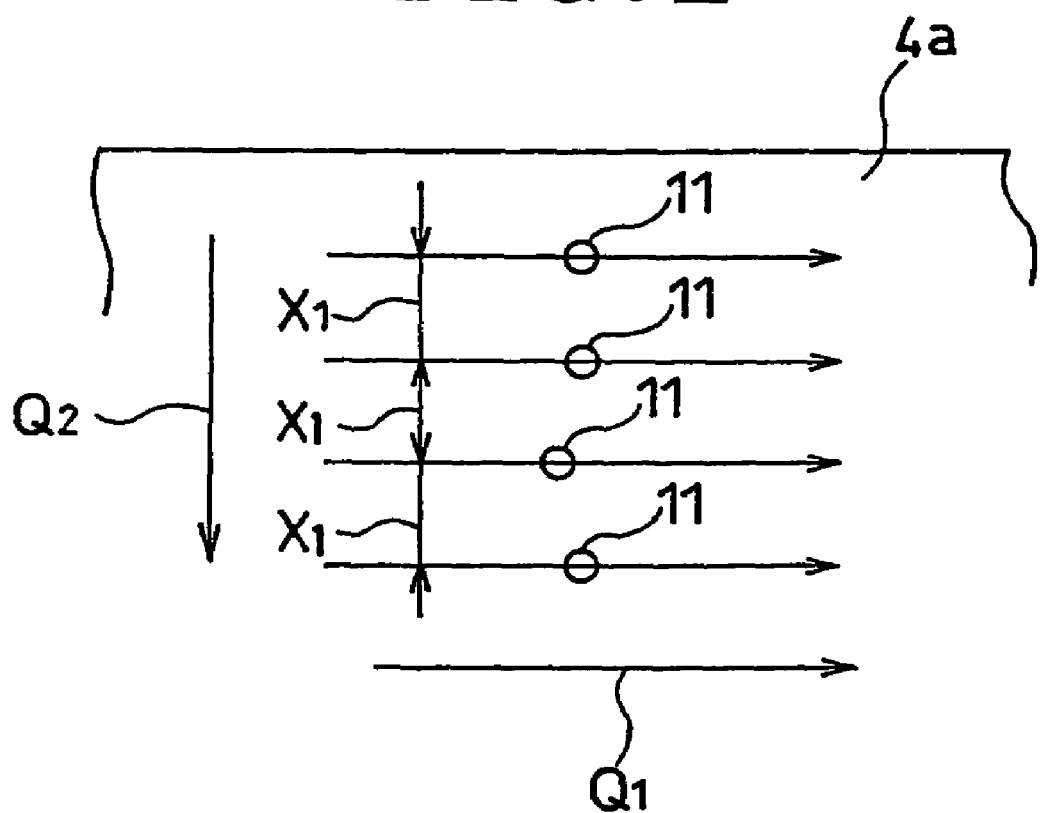
FIG. 2 is a schematic diagram showing an arranged state of beam spots on an image recording surface.
Figure 3:
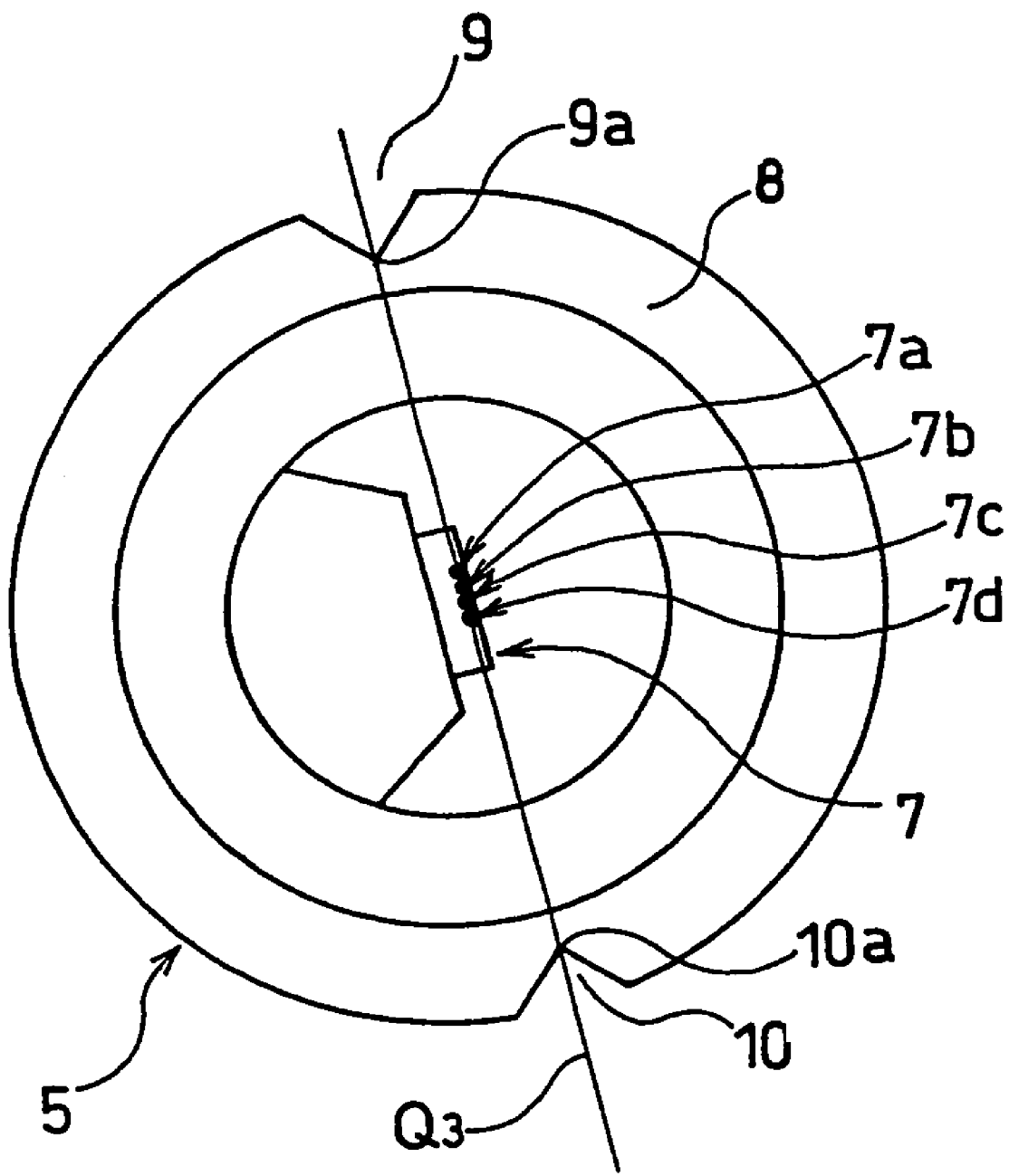
FIG. 3 is a schematic diagram for explaining an arranged state of light emitting points in a multi-beam laser diode.
Figure 5A:
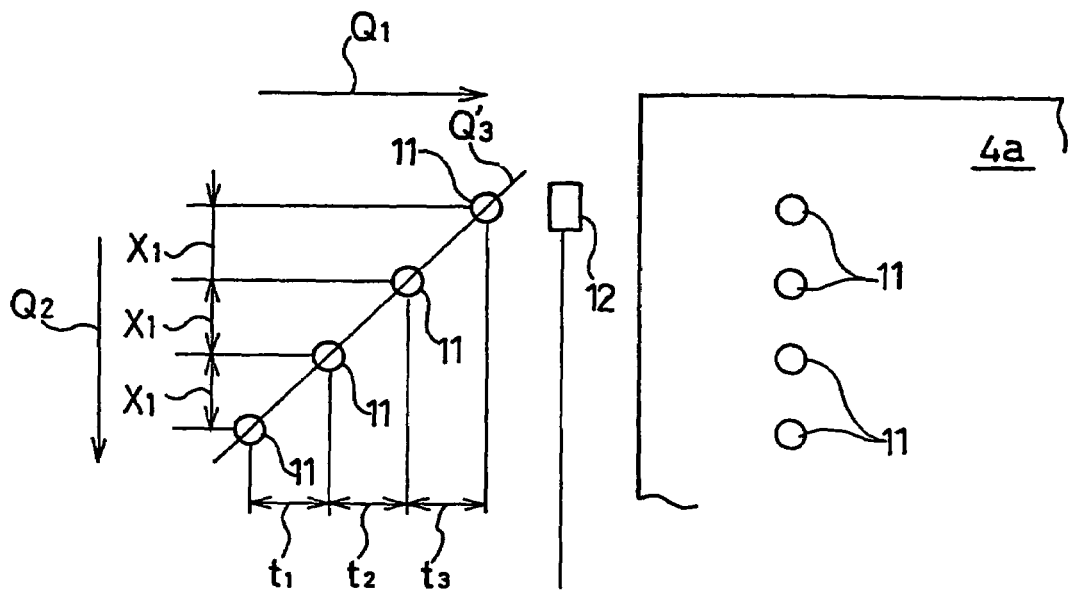
FIG. 5 is an explanatory diagram for explaining another example of controlling write start positions on the image recording surface, in which (a) illustrates a relation between an arranged direction of beam spots and write start positions and (b) is a timing diagram for explaining light emission timings of the light emitting points.
Figure 5B:
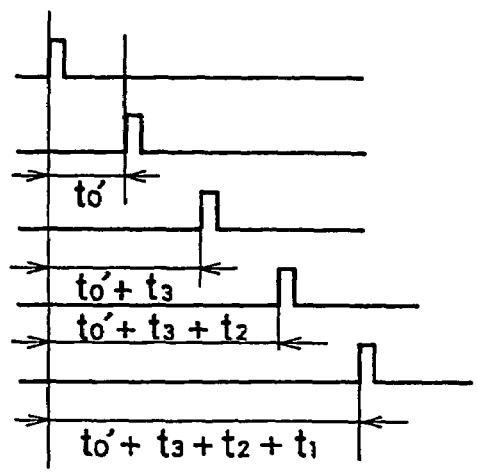
Figure 6:
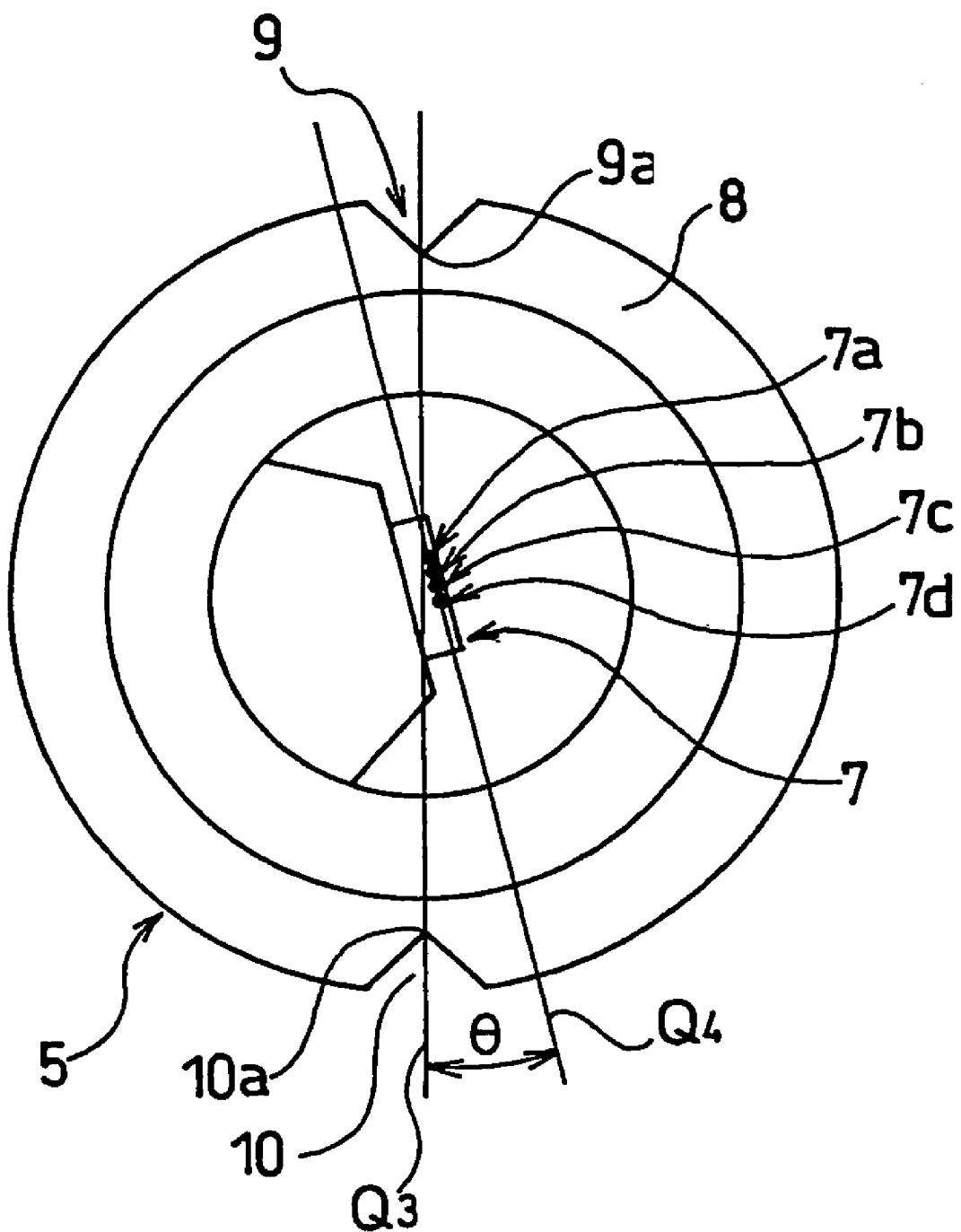
FIG. 6 is a diagram for explaining an inclination between an arranged direction of the light emitting points in the multi-beam laser diode and the direction of a standard design line.
Figure 7:
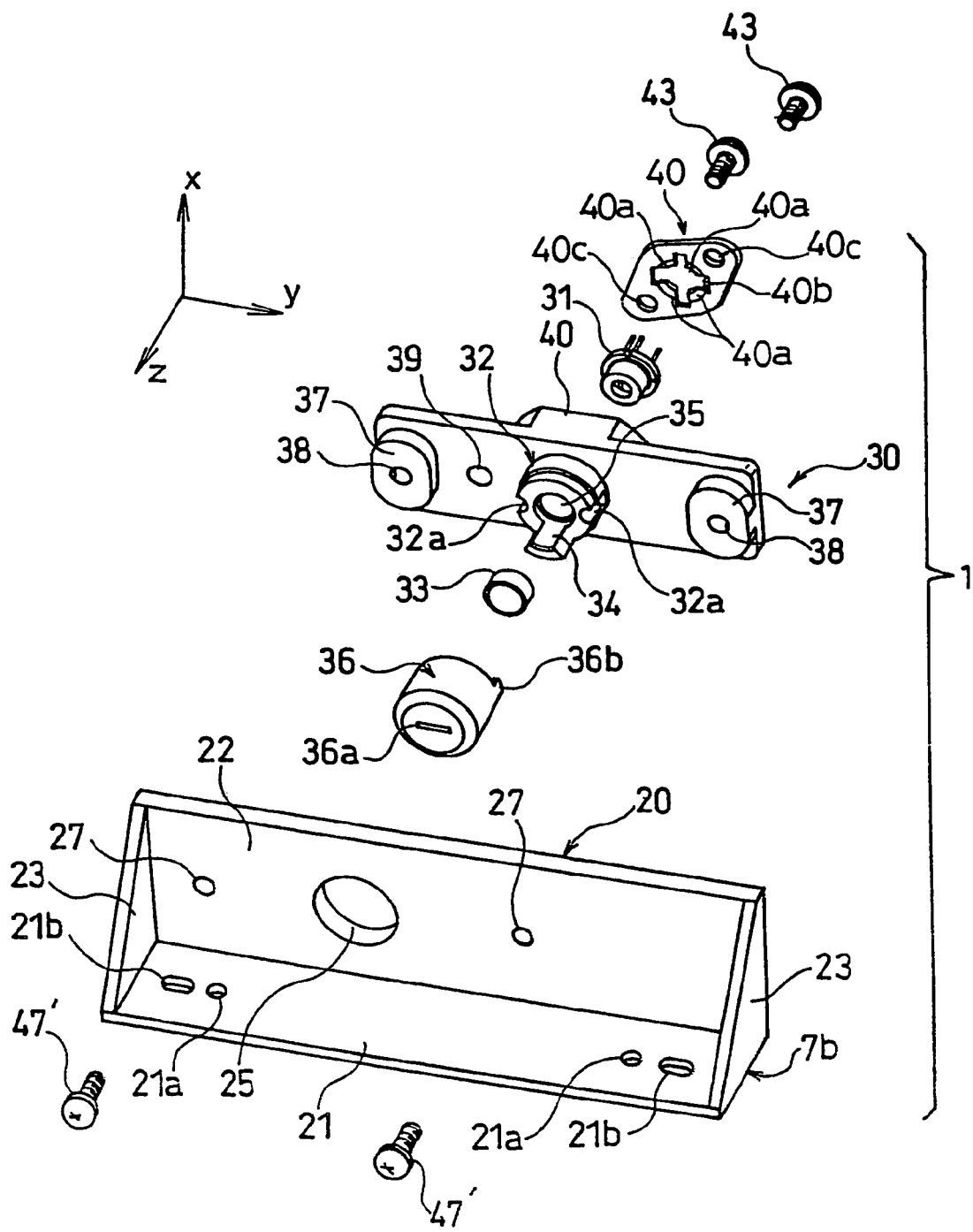
FIG. 7 is an exploded perspective view of a multi-beam source unit according to the first embodiment of the present invention.

FIG. 7 is an exploded perspective view of a multi-beam source unit 19 embodying the present invention. In the same figure, the reference numeral 20 denotes a mounting bracket. The mounting bracket 20 has a bottom wall portion 21, an upright wall portion 22, and a pair of side wall portions 23.

In the bottom wall portion 21 are formed a pair of positioning holes 21a and a pair of screw inserting holes 21b.

Figure 8:
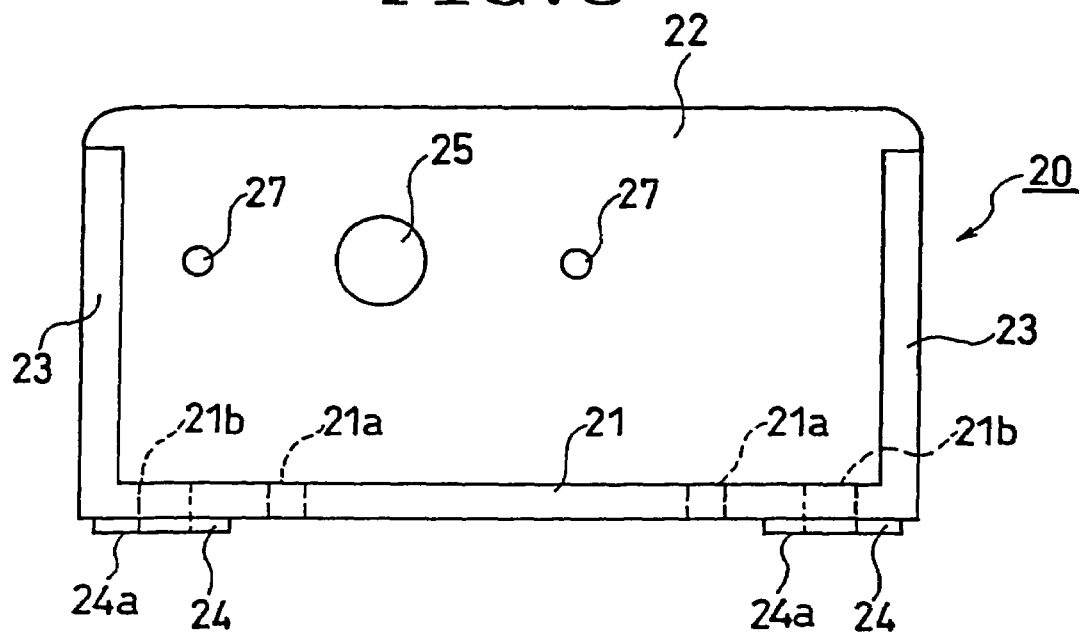
FIG. 8 is a front view of a mounting bracket shown in FIG. 7.

On the underside of the bottom wall portion 21 are formed positioning reference portions 24, as shown in FIG. 8. The positioning reference portions 24 are each provided with a horizontal scanning direction reference plane 24a for defining a horizontal scanning direction. The positioning reference portions 24 are to be confronted with positioning reference portions of a housing serving as a body portion of an image forming apparatus which will be described later.

Figure 9:
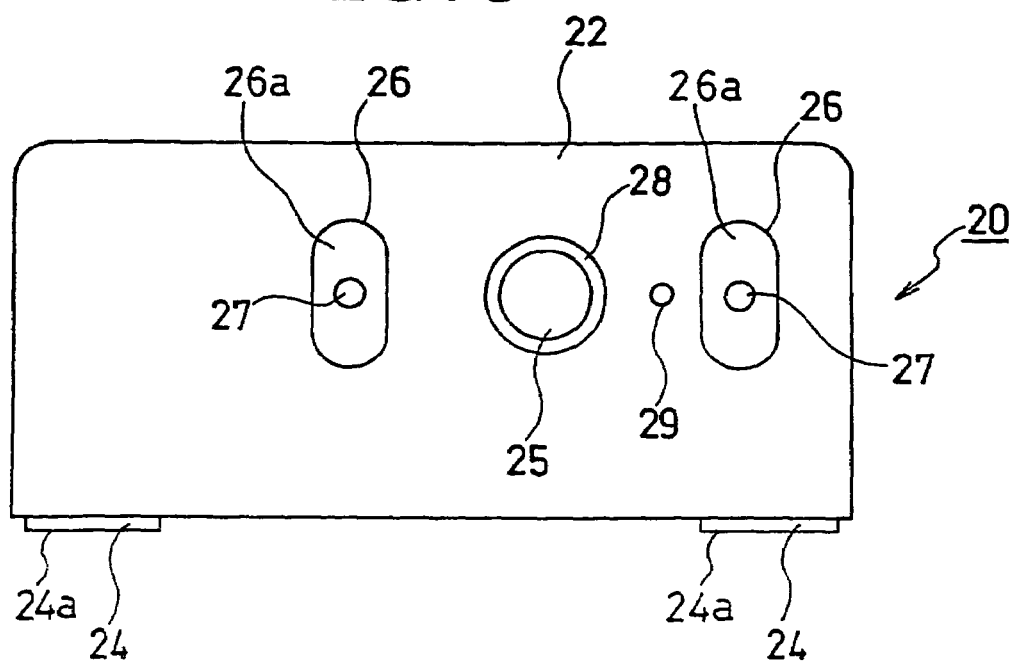
FIG. 9 is a rear view thereof.
Figure 10:
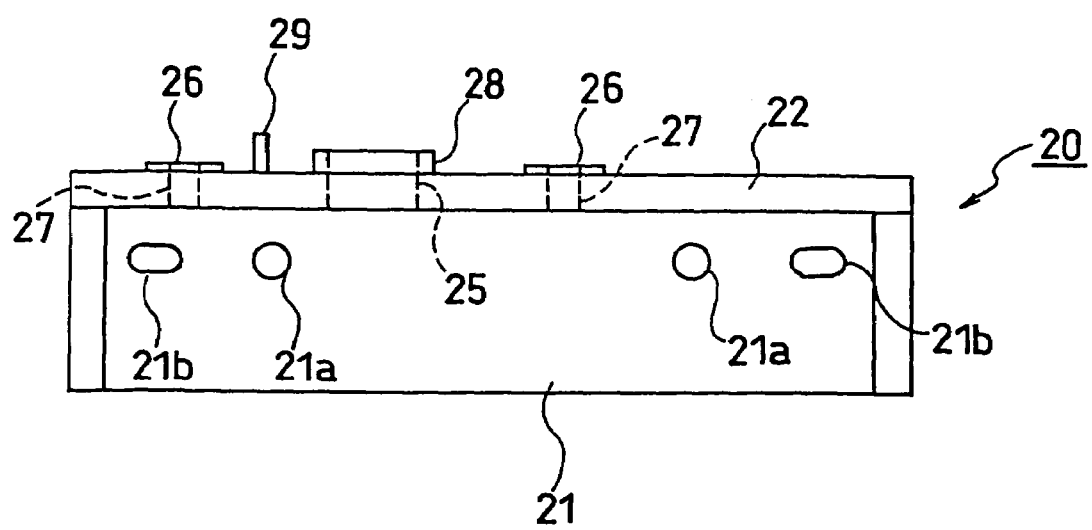
FIG. 10 is a plan view thereof.

In the upright wall 22 is formed a circular through hole 25 and on the back side of the upright wall 22 are formed a pair of positioning reference portions 26 on both sides of the through hole 25, as shown in FIGS. 9 and 10.

The positioning reference portions 26 are respectively provided with vertical scanning direction reference planes 26a substantially perpendicular to the horizontal scanning direction reference planes 24a of the positioning reference portions 24. In the paired positioning reference portions 26 are formed screw inserting holes 27, respectively.

Further, on the back side of the upright wall portion 22 is formed a circular fitting cylinder 28 concentrically with the circular through hole 25 and a rotation restricting pin 29 is projected between the circular fitting cylinder 28 and one positioning reference portion 26.

Figure 11:
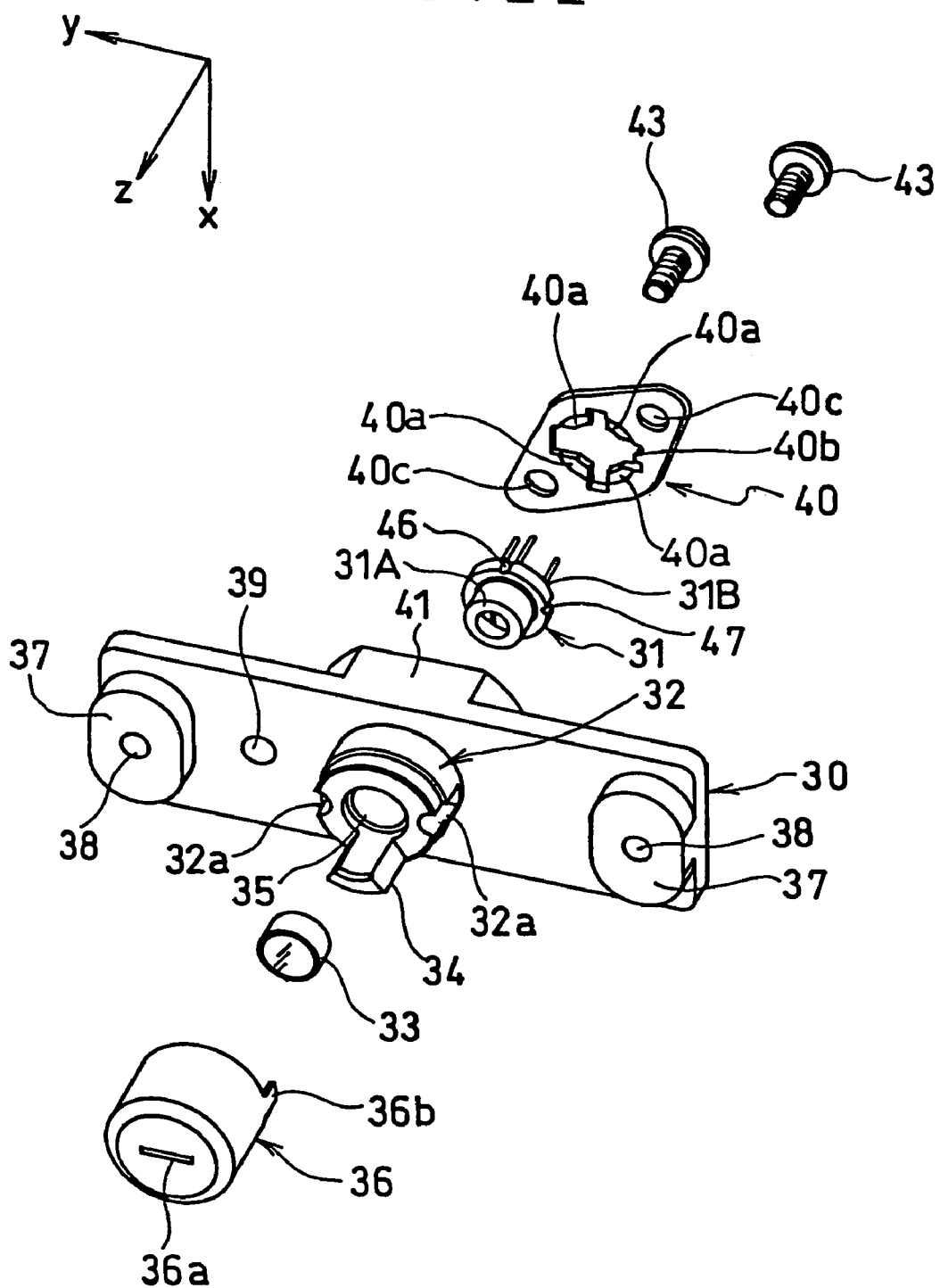
FIG. 11 is an enlarged view of a principal portion of the multi-beam source unit shown in FIG. 7 as seen from the front side thereof.

A base member 30 is attached to the back side of the upright wall portion 22. The base member 30 holds a multi-beam laser diode 31. As shown on a larger scale in FIG. 11, the base member 30 is provided on its front side with a circular fitting cylinder 32 to be fitted in the fitting cylinder 28.

An inside diameter of the fitting cylinder 28 and the diameter of the circular through hole 25 are equal to each other and an outside diameter of the fitting cylinder 32 is formed a little smaller than the diameter of the circular through hole 25 to the extent that the fitting cylinder 32 can rotate around the circular through hole 25.

The fitting cylinder 32 is formed with an arcuate support portion 34 for supporting a collimator lens 33. The collimator lens 33 functions to collimate multi-laser beams emitted from the multi-beam laser diode 31. As to the details of mounting the collimator lens 33 to the circular support portion 34, it will be described later.

The fitting cylinder 32 has a central opening 35. A pair of cutout portions 32a are formed in the fitting cylinder 32 on both sides of the opening 35. An aperture member 36 for shaping the multi-laser beams is attached to the circular fitting cylinder 32. The aperture member 36 is formed with a slit 36a which extends long horizontally and a pair of engaging pieces 36b for engagement with the paired cutout portions 32a. The multi-laser beams are emitted through the opening 35 toward the collimator lens 33.

A pair of positioning reference portions 37 are formed at both side positions of the base member 30 which positions correspond to the positions of the paired positioning reference portions 26, with tapped holes 38 being formed in the positioning reference portions 37 respectively. Between one positioning reference portion 37 and the fitting cylinder 32 is formed a loose insertion hole 39 for loose insertion therein of the rotation restricting pin 29.

Figure 12:
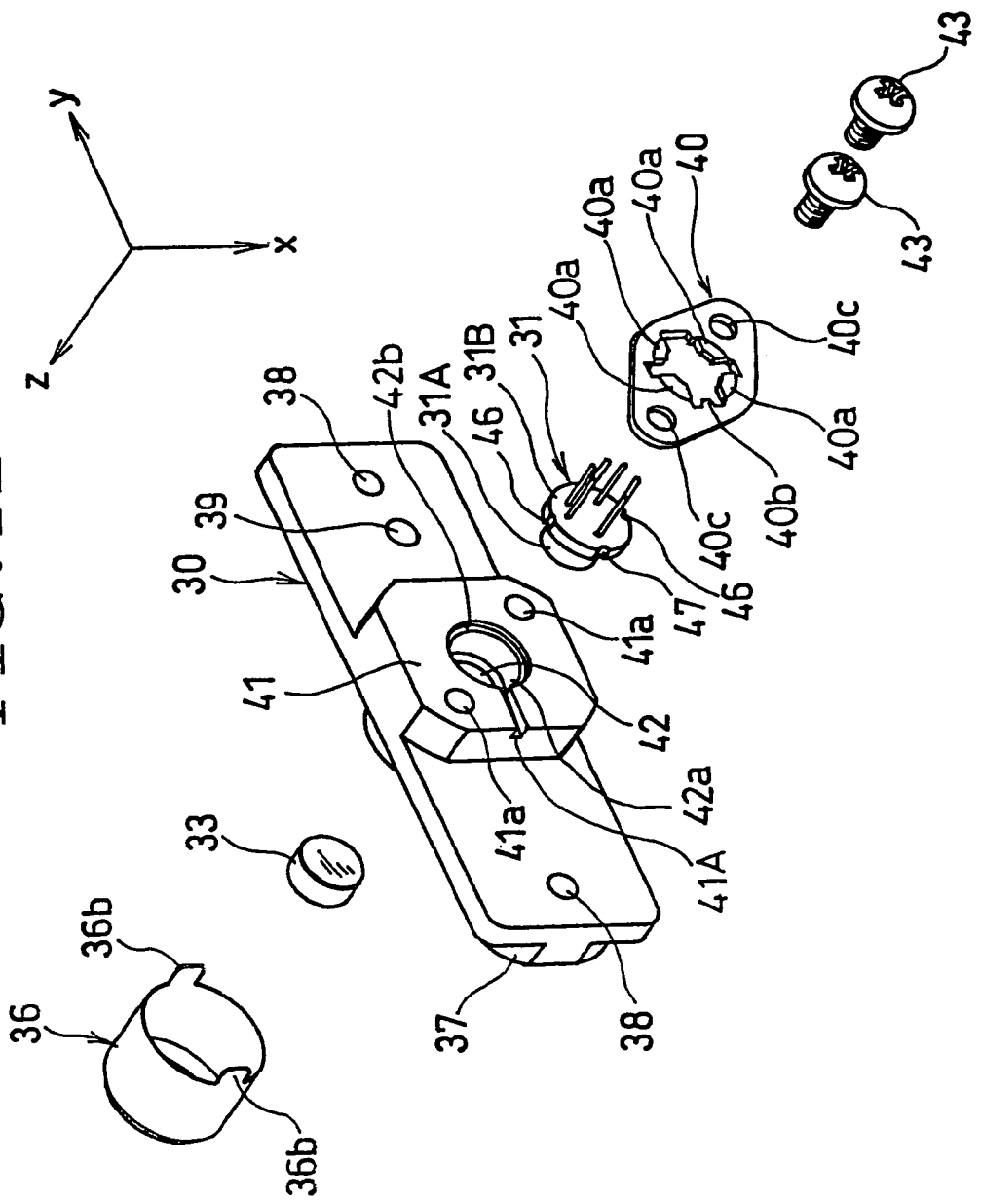
FIG. 12 is an enlarged view of the principal portion of the multi-beam source unit as seen from the back side thereof.

On the back side of the base member 30, as shown on a larger scale in FIG. 12, there is formed a pressing plate mounting portion 41 for mounting a pressing plate 40. The pressing plate 40 is centrally provided with four pressing spring pieces 40a, one engaging piece 40b for positioning and a pair of through holes 40c.

In the pressing plate mounting portion 41 is formed a fitting hole 42 which is concentric with the opening 35. The fitting hole 42 is formed with a mounting reference hole 42a for a stem 31B and an abutting reference plane 42b for the stem. In the pressing plate mounting portion 41 is formed a positioning groove 41A which is in communication with the fitting hole 42, as shown in FIG. 12. The positioning reference hole 41A is used at the time of positioning and mounting the multi-beam laser diode 31 to the pressing plate mounting portion 42 of the base member 30 by means of a positioning jig which will be described later. If the multi-beam laser diode 31 is mounted to the pressing plate mounting portion 42 with use of a positioning jig, the positioning of the multi-beam laser diode in the rotational direction with respect to the pressing plate mounting portion 42 can be done precisely. But the positioning can be effected using the engaging piece 40b for positioning even without using any adjusting device for positioning, provided the use of the positioning jig is essential in the case of using a pressing plate 40 nor formed with the engaging piece 40b for positioning.

Figure 34:
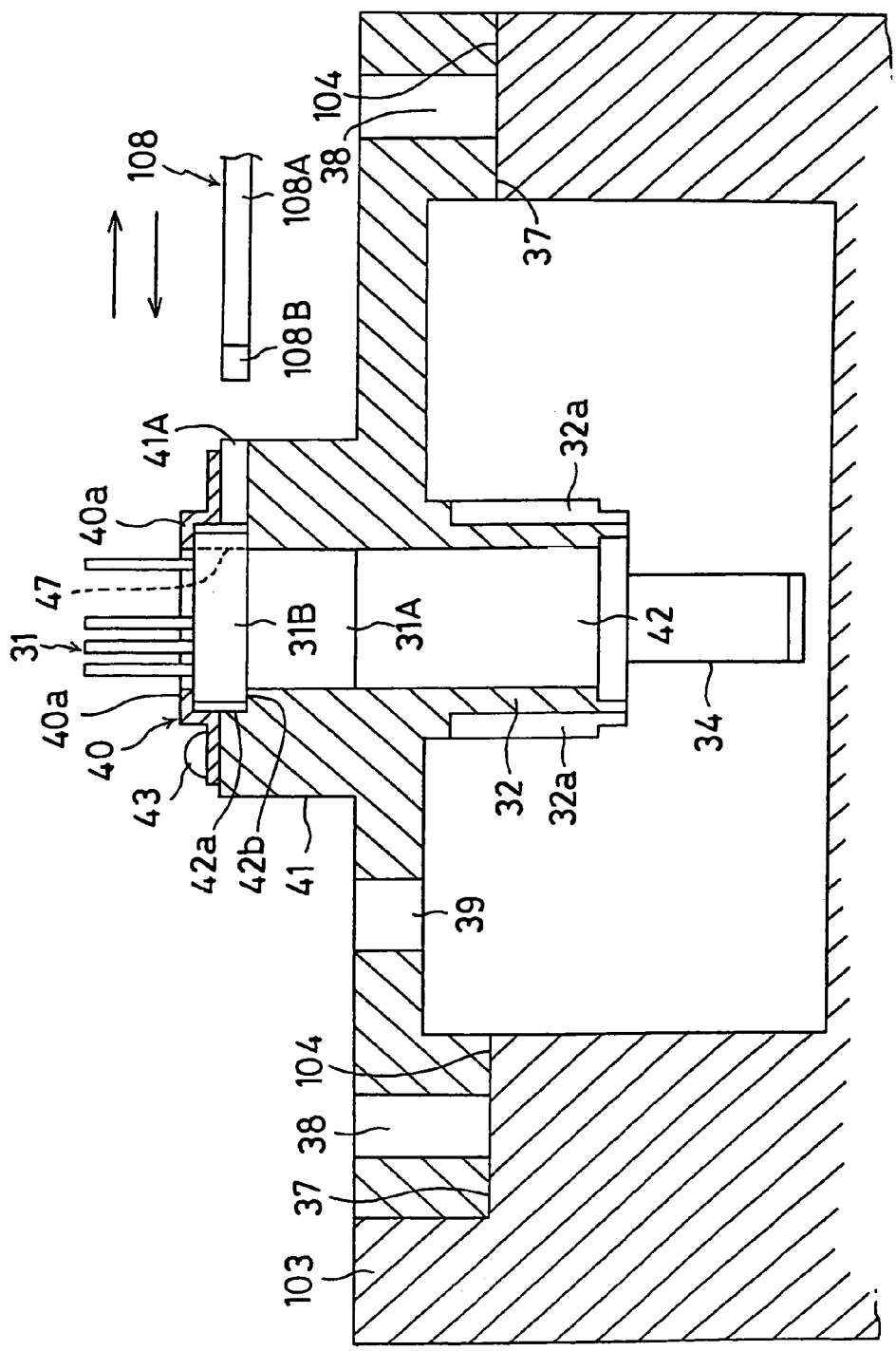
FIG. 34 is a partially enlarged sectional view for explaining positioning of multi-laser beams with use of the positioning jig.

The mounting reference hole 42a is formed a little larger in diameter than the stem 31B and the depth thereof is set to the extent that when the stem 31B is pushed against the abutting reference plane 42b, the back of the stem projects from the back of the pressing plate mounting portion 41, as shown in FIG. 34.

A cylindrical body portion 31A of the multi-beam laser diode 31 is fitted in the fitting hole 42. In the pressing plate mounting portion 41 are formed a pair of tapped holes 41a on both sides of the fitting hole 42 correspondingly to the through holes 40c formed in the pressing plate 40. The diameter of each through hole 40c is a little larger than the diameter of a shaft portion of a screw 43 with spring washer which will be described later.

The pressing plate 40 is pressed and fixed to the pressing plate mounting portion 41 by fitting the cylindrical body portion 31A of the multi-beam laser diode 31 into the fitting hole 42, then putting the pressing spring pieces 40a on the back of the stem 31B of the multi-beam laser diode 31, and further by bringing screws 43 into threaded engagement with the tapped holes 41a respectively.

[Construction of the Multi-Beam Laser Diode 31]

Figure 13:
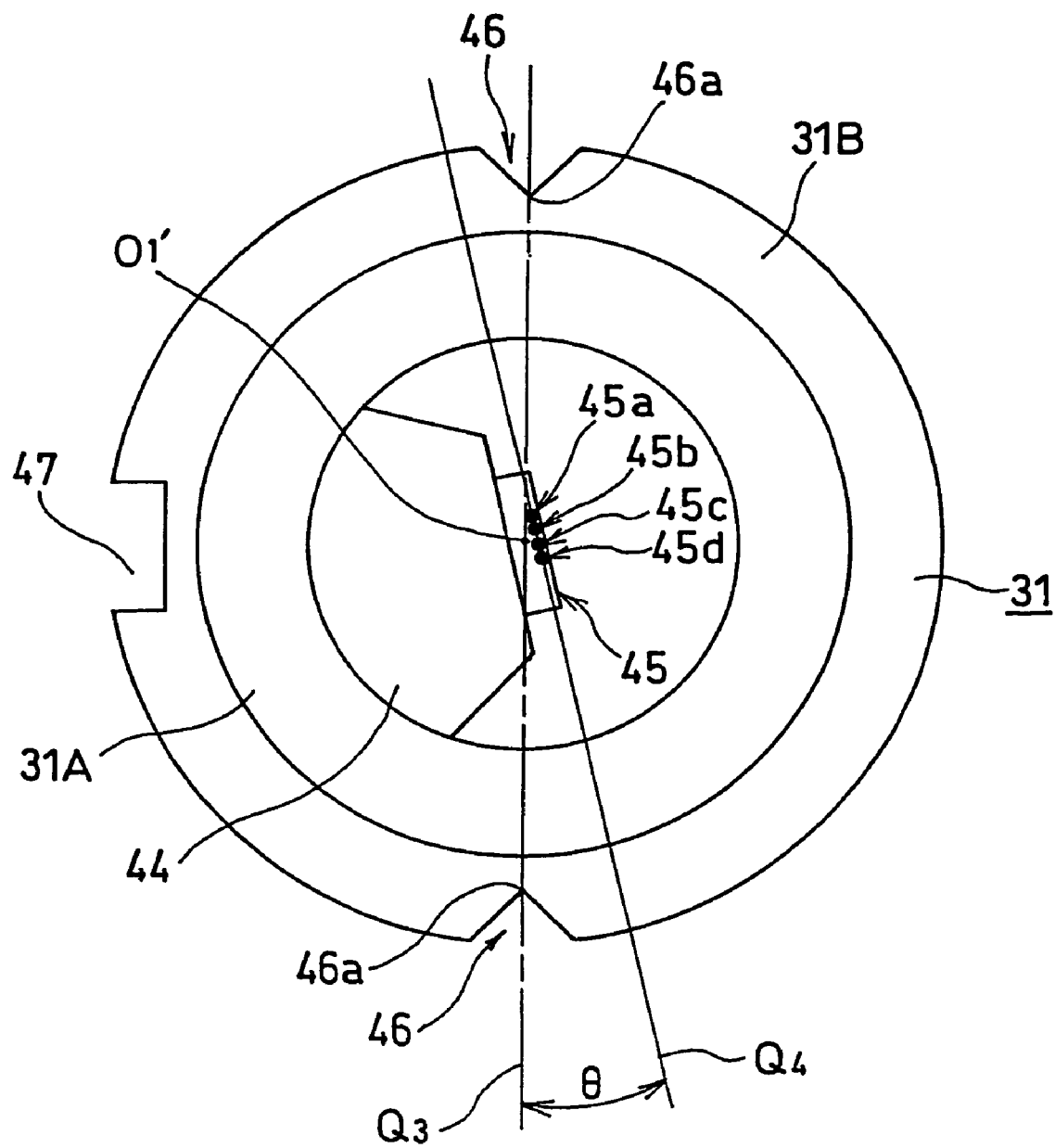
FIG. 13 is an enlarged plan view of a multi-beam laser diode shown in FIG. 7.

In the interior of the cylindrical body portion 31A of the multi-beam laser diode 31 is formed a pedestal 44, which is provided with a rectangular light emitting chip portion (light emitting portion) 45, as shown in FIG. 13. In the illustrated construction, four light emitting points 45a to 45d are provided in the light emitting chip portion 45. The stem 31B is formed with a pair of acute-angled cutout portions 46. The light emitting points 45a–45d are positioned near a center O1 of the cylindrical body portion 31A.

The light emitting points 45a–45d are to be arranged spacedly on a virtual straight line Q3 joining acute points 46a of the paired cutout portions 46, but due to errors in the manufacture of the multi-beam laser diode 31 an arranged direction Q4 joining the light emitting points 45a–45d is inclined with respect to the virtual straight line Q3. The stem 31B is formed with a rectangular cutout portion 47 as an engaging portion for positioning at a position orthogonal to the virtual straight line Q3.

Although in this embodiment the virtual straight line Q3 is defined by joining acute points of the paired cutout portions 46, a pair of convex portions of an acute shape may be formed on the stem 31B side to define the virtual straight line Q3.

Figure 14:
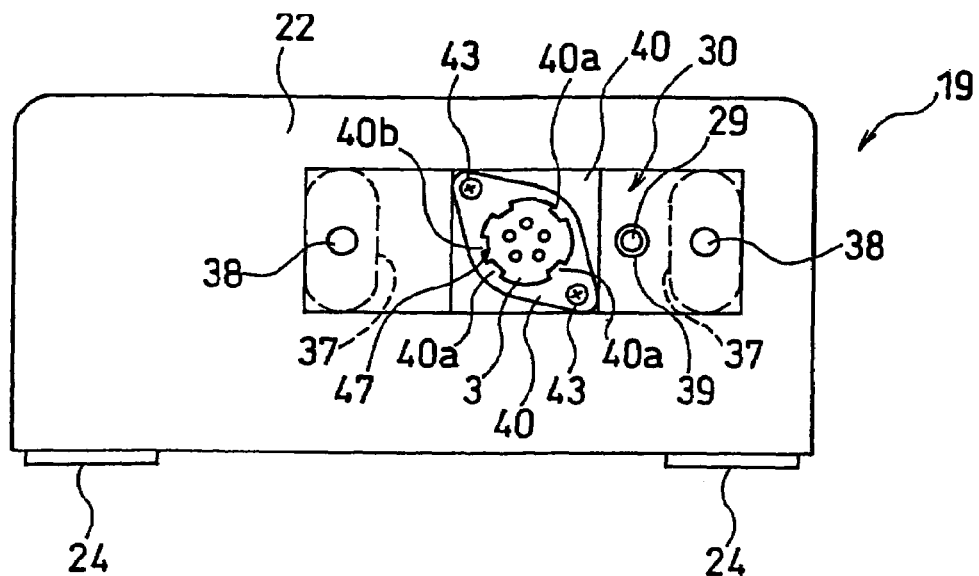
FIG. 14 is a rear view of the multi-beam source unit shown in FIG. 7.

The cutout portion 47 engages the engaging piece 40b of the pressing plate 40 and is used as a positioning reference at the time of fixing the multi-beam laser diode 31 to the base member 30. As shown in FIG. 14, the multi-beam laser diode 31 is positioned relative to the base member 30 by engagement of the engaging piece 40b with the cutout portion 47 and is fixed to the base member 30 with screws 43. Although the rectangular cutout portion 47 is formed as a positioning engaging portion in the stem 31B, there may be formed a rectangular convex portion for positioning instead. In this case, an engaging recess for engagement with the engaging convex portion for positioning is formed instead of forming the engaging piece 40b on the pressing plate 40 side.

[Adjusting the Collimator Lens 33 in the Multi-Beam Source Unit 19]

The position of the collimator lens 33 is adjusted before mounting the base member 30 to the mounting bracket 20. The collimator lens 33 is arranged by an arranging/feeding device (not shown), then is taken out one at a time from the same device by means of a collimator lens holding arm and is conveyed to the arcuate support portion 34. The arcuate support portion 34 is coated with a photo-curing type adhesive (an ultraviolet-curing type adhesive) and the collimator lens 33 is disposed at a predetermined initial design position on the thus-coated arcuate support portion 34. The collimator lens holding arm is provided on a three-axis movable stage capable of being controlled independently in three-axis directions.

Next, for aligning the optical axis of the collimator lens 33 with the rotational center, the collimator lens 33 is adjusted its positions in x- and y-axis directions and is also adjusted its position in z-axis direction (position in the optical axis direction). This positional adjustment in the optical axis direction of the collimator lens 33 is conducted for making the light emitting points 45a–45d coincident with a focal position (focal plane) of the collimator lens 33 to enhance the collimatability and the foregoing three-axis movable stage is used for the adjustment.

The positional adjustment of the collimator lens 33 is performed for each of the light emitting points 45a–45d and a mean value of optimal positions thus obtained is used as a representative characteristic. The collimator lens 33 is positioned at the mean value.

After the positional adjustment of the collimator lens 33, ultraviolet light (UV light) as a parallel beam is radiated from above the collimator lens 33 and the ultraviolet-curing type resin is cooled with air while being cured by the ultraviolet light which has passed through the collimator lens 33, thereby allowing the collimator lens 33 to be bonded and fixed to the arcuate support portion 34.

Figure 15:
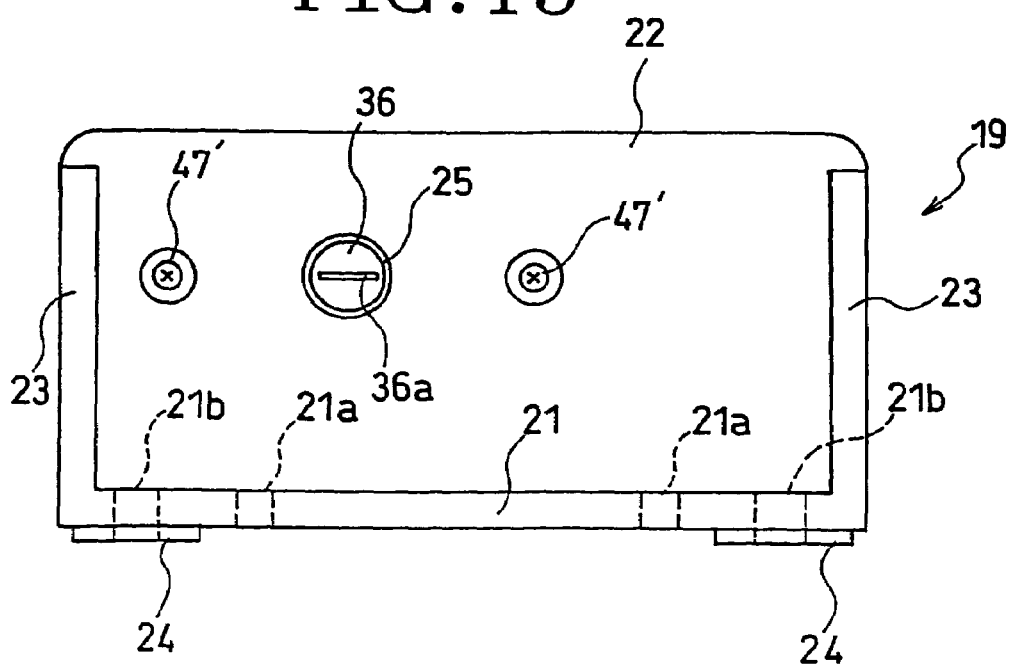
FIG. 15 is a front view thereof.

As shown in FIG. 15, the base member 30 is temporarily fixed to the upright wall portion 22 by means of screws 47' with spring washer, whereby the multi-beam source unit 19 is assembled.

[Adjusting the Angle of the Multi-Beam Source Unit]

The multi-beam source unit 19 with the collimator lens 33 bonded and fixed thereto is then set to an adjusting device.

Figure 16:
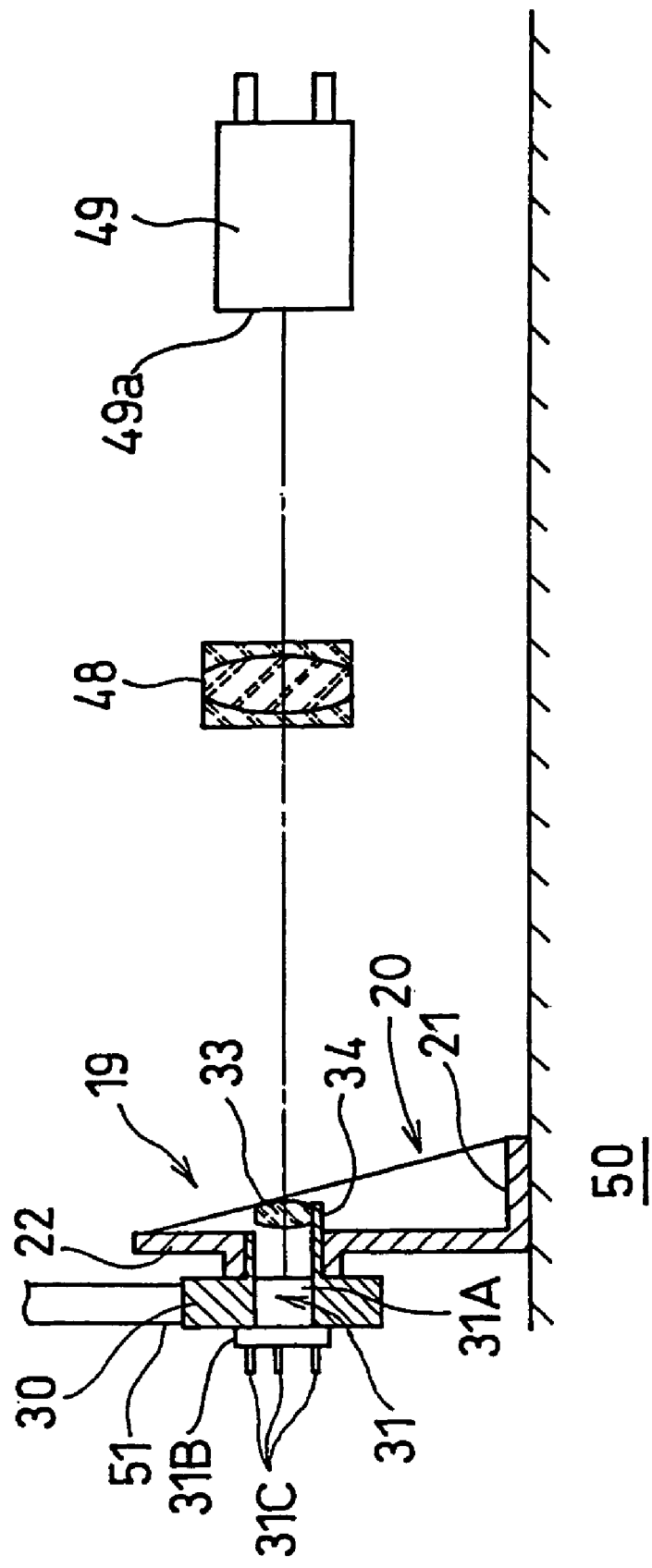
FIG. 16 is a schematic diagram of an adjusting device for the multi-beam source unit shown in FIG. 7.

FIG. 16 is a schematic diagram of an adjusting device for use in the multi-beam laser diode adjusting method. The adjusting device is constituted as an automatic adjusting system, whose detailed construction will be described later.

The adjusting device has a condenser lens (focusing lens) 48 and an image pickup device 49. The adjusting device is further provided with a reference mounting portion 50. The multi-beam source unit 19 is set to the adjusting device in a state in which horizontal scanning direction reference planes 24a thereof are brought face to face with a reference plane of a reference mounting portion 50.

Figure 17:
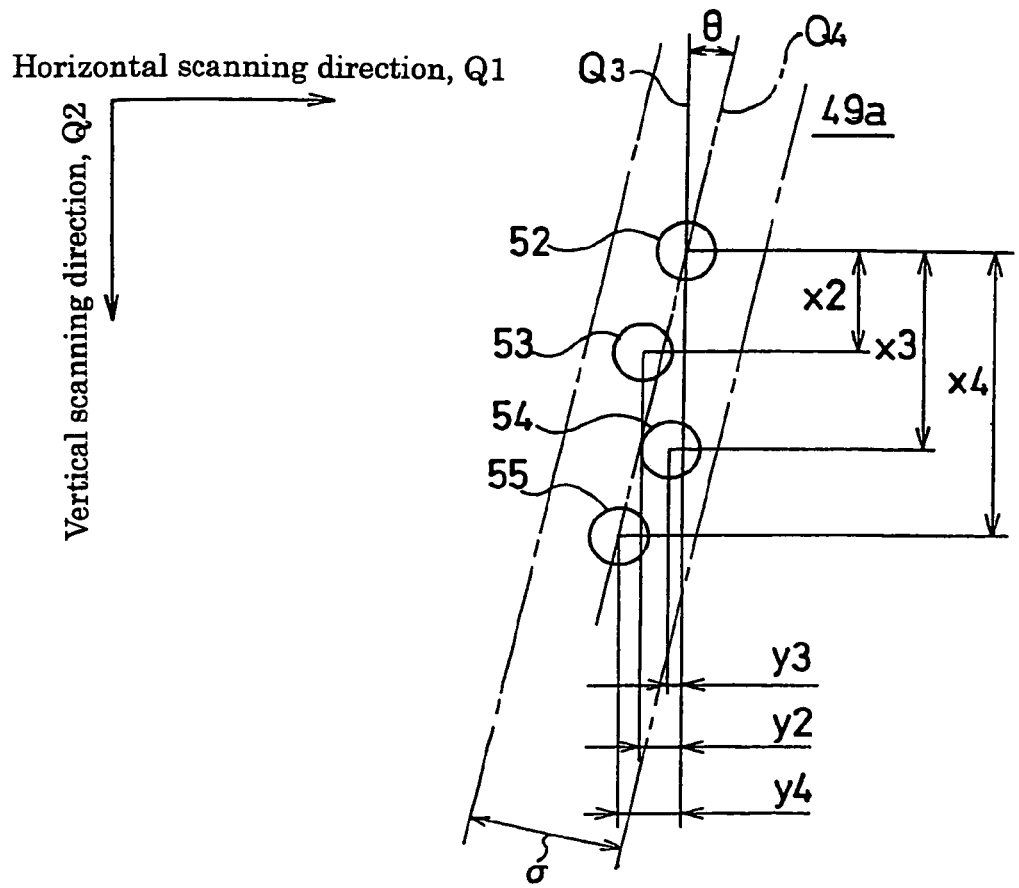
FIG. 17 is an explanatory diagram showing an arranged state of beam spots focused on an image pickup surface shown in FIG. 7.

A tip 51 of a micrometer is brought into contact with an upper end face of the base member 30 at a position more outside than the position where the rotation restricting pin 29 is present. In this state, a drive voltage is applied to terminals 31c of the multi-beam laser diode 31 simultaneously, whereby the light emitting points 45a–45d are activated and beam spots 52–55 corresponding to the light emitting points 45a–45d are formed on an image pickup surface 49a which corresponds to an image recording surface 4a, as shown in FIG. 17.

Assuming that there is no mounting error in design, the virtual straight line Q3 coincides with the vertical scanning direction Q2, namely, the standard design line. The light emitting points 45a–45d vary due to manufacturing errors and it is presumed that their positions in the horizontal scanning direction Q1 and intervals in the vertical scanning direction Q2 on the image pickup surface 49 are not constant. Thus, the arranged direction Q4 as an arranged state of the beam spots 52–55 is not always existent.

In this embodiment, therefore, a straight line obtained by joining two light emitting points 45a and 45d, which are remotest from each other out of the four light emitting points 45a–45d, (by joining the beam spots 52 and 55), is regarded as being the arranged direction Q4 and the angle $\theta$ of the arranged direction Q4 relative to the virtual straight line Q3 is measured.

Given that, in the vertical scanning direction, the spacing between the beam spots 52 and 53 is x2, the spacing between the beam spots 52 and 54 is x3, and the spacing between the beam spots 52 and 55 is x4, while, in the horizontal scanning direction, the spacing between the beam spots 52 and 53 is y2, the spacing between the beam spots 52 and 54 is y3, and the spacing between the beam spots 52 and 55 is y4, the angle $\theta$ is determined in accordance with the following equation:

$$\theta = \tan^{-1}(y4/x4)$$

Instead of regarding the straight line obtained by joining the two remotest light emitting points 45a and 45d out of the light emitting points 45a–45d (the straight line obtained by joining the beam spots 52 and 55) as the arranged direction Q4, there may be adopted a method involving obtaining an approximate straight line by the method of least squares, using the approximate straight line thus obtained as the arranged direction Q4, and determining the angle $\theta$ of the arranged direction Q4 relative to the virtual straight line Q3.

$$\theta = (\Sigma(x'\,ixy'\,i) - \Sigma(x'\,ixy'\,i)/N)/(\Sigma x'\,i^2 - (\Sigma x'\,i)^2)/N)$$

where N stands for the number of light emitting points (here, N=4), x' i and y' i stand for positions in x and y directions, respectively, of each light emitting point, and i=1–N.

Next, in accordance with the angle $\theta$ thus obtained, a pulse motor coupled directly to the micrometer is operated to turn the base member 30 by the angle $\theta$ so that the arranged direction Q4 becomes aligned with the vertical scanning direction Q2.

Then, the collimator lens 33 is released from the collimator lens holding arm and measurement is made to see whether the arranged state of the beam spots 52–55, namely, spacings y2–y4 in the horizontal scanning direction Q1 of the beam spots 52–55, are within a specification $\sigma$ or not.

If the spacings y2–y4 in the horizontal scanning direction Q1 of the beam spots 52–55 are output the specification $\sigma$, that is, if the arranged state of the beam spots is not proper, the base member 30 is again subjected to the angular adjustment and the collimator lens 33 is adjusted its position. Thereafter, the screws 47 with spring washer are tightened to a further extent to fix the base member 30 to the mounting bracket 20 unrotatably. Then, the laser beams are measured for optical characteristics and arranged state and the multi-beam laser diode 31 is turned OFF to complete the adjusting work.

Figure 18:
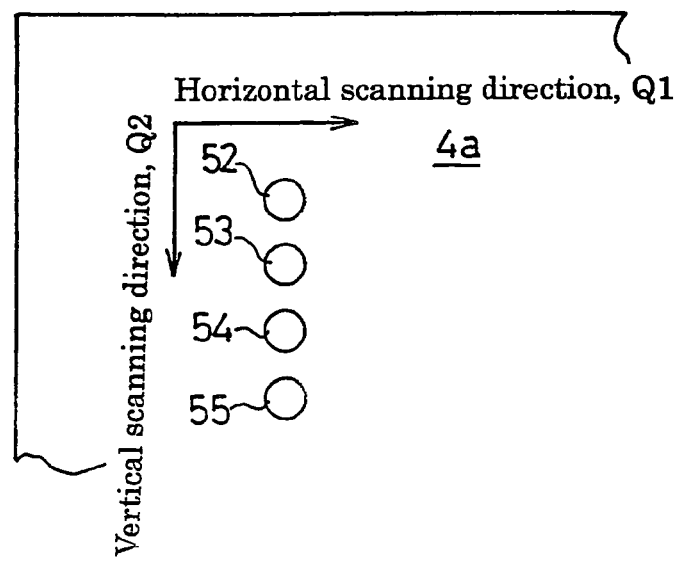
FIG. 18 is an explanatory diagram showing an arranged state of beam spots adjusted by the adjusting device shown in FIG. 16.

As a result, as shown in FIG. 18, the beam spots 52–55 are arranged straight in the vertical scanning direction Q2 and thus the write start positions on the image recording surface 4a are aligned. Consequently, it is possible to simplify the configurations of control circuit and drive circuit disposed in the body portion of the image forming apparatus.

Thus, in the multi-beam source unit assembling and adjusting process there are performed both measuring an arranged state of the light emitting points 45a–45d in the multi-beam laser diode 31 and rotating the multi-beam laser diode 31 so as to align the arranged direction of the light emitting points with the direction of the standard design line on the basis of the measurement of the light emitting points 45a–45d arranged state. The aperture member 36 is mounted after this adjustment.

Although the arranged direction Q4 as the arranged state is here evaluated, there may be adopted a method involving rotating the base member 30 by predetermined angles to determine spacings (deviations) in the horizontal scanning direction Q1, regarding the angle θ as the arranged direction Q4 of the light emitting points 45a–45d at which angle the maximum deviation out of the deviations y2, y3, and y4 becomes minimum, and rotating the multi-beam laser diode 31 in that direction to align the write start positions of the beam spots 52–55.

[Schematic Construction of the Body Portion of the Image Forming Apparatus]

Figure 19:
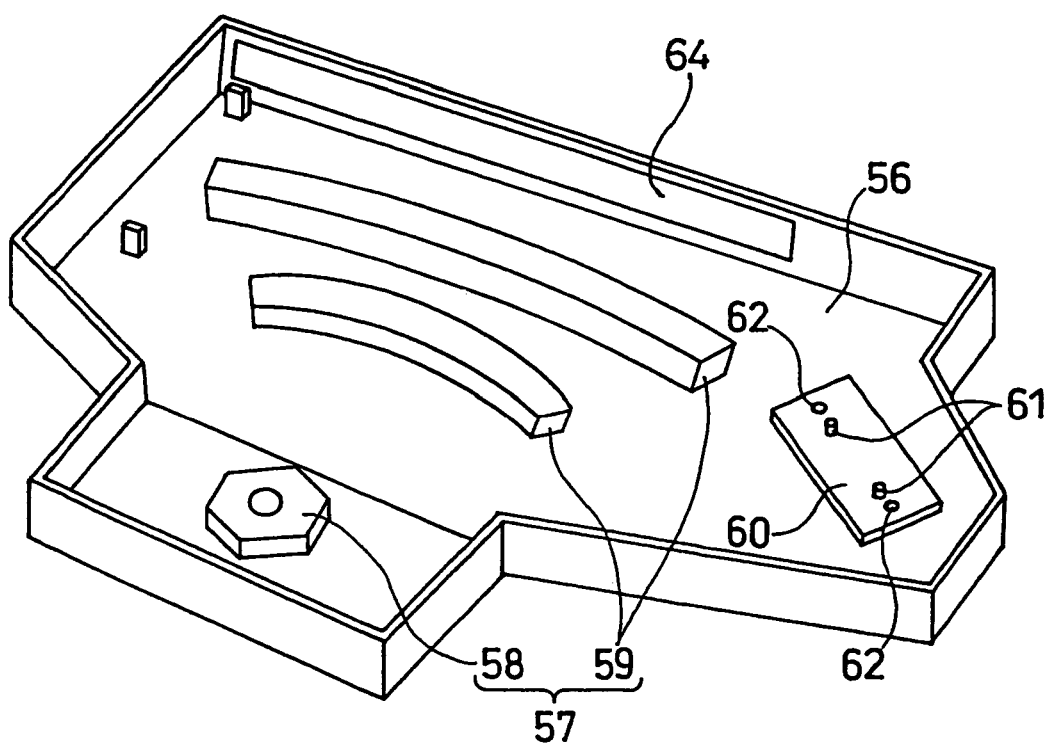
FIG. 19 is a perspective view showing a schematic construction of a body portion of an image forming apparatus to which the multi-beam source unit shown in FIG. 7 is to be mounted.
Figure 20:
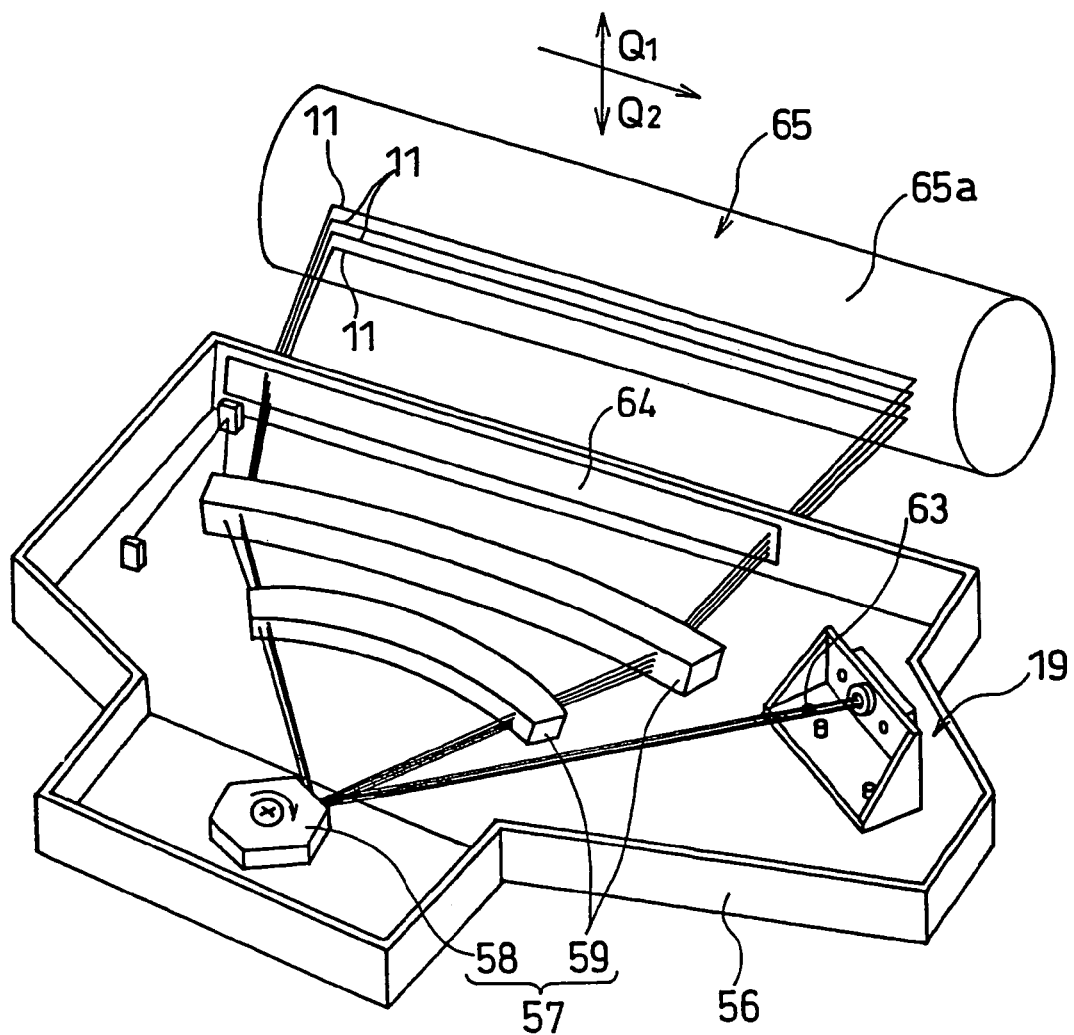
FIG. 20 is a perspective view showing a schematic construction of the body portion of the image forming apparatus with the multi-beam source unit shown in FIG. 7 mounted thereto.

FIGS. 19 and 20 illustrate a schematic construction of a housing of the image forming apparatus body portion, of which FIG. 19 illustrates a state prior to mounting of the multi-beam source unit 19 to a housing 56 and FIG. 20 illustrates a mounted state of the multi-beam source unit 19 to the housing 56.

A scanning optical system 57 is mounted on the housing 56. The scanning optical system 57 is substantially composed of a polygon mirror 58 and f θ lenses 59. A positioning reference portion 60 is provided on the bottom wall of the housing 56. As shown in FIG. 19, the positioning reference portion 60 is provided with a pair of positioning pins 61 and a pair of tapped holes 62. In the multi-beam source unit 19, as shown in FIG. 20, the reference planes of its positioning reference portions 24 are confronted with a reference plane of the positioning reference portion 60, positioned by the positioning pins 61, and fixed to the positioning reference portion 60 with screws 63.

In one side wall of the housing 56 is formed an opening 64 which extends in a direction parallel to the horizontal scanning direction Q1. When the multi-beam laser diode 31 is driven to activate the light emitting points 45a–45d simultaneously, multi-laser beams are deflected in the horizontal scanning direction Q1 by the polygon mirror 58, then pass through the opening 64 and are radiated to a photosensitive surface 65a of a photosensitive drum 65 serving as a recording medium to form four beam spots 11 on the photosensitive surface 65a. The four beam spots 11 are substantially aligned in the vertical scanning direction Q2 on the photosensitive surface 65a because the light emitting points 45a–45d of the multi-beam laser diode 31 are adjusted in the vertical scanning direction Q2.

[Explaining the Details of Adjusting the Multi-Beam Source Unit]

Figure 21:
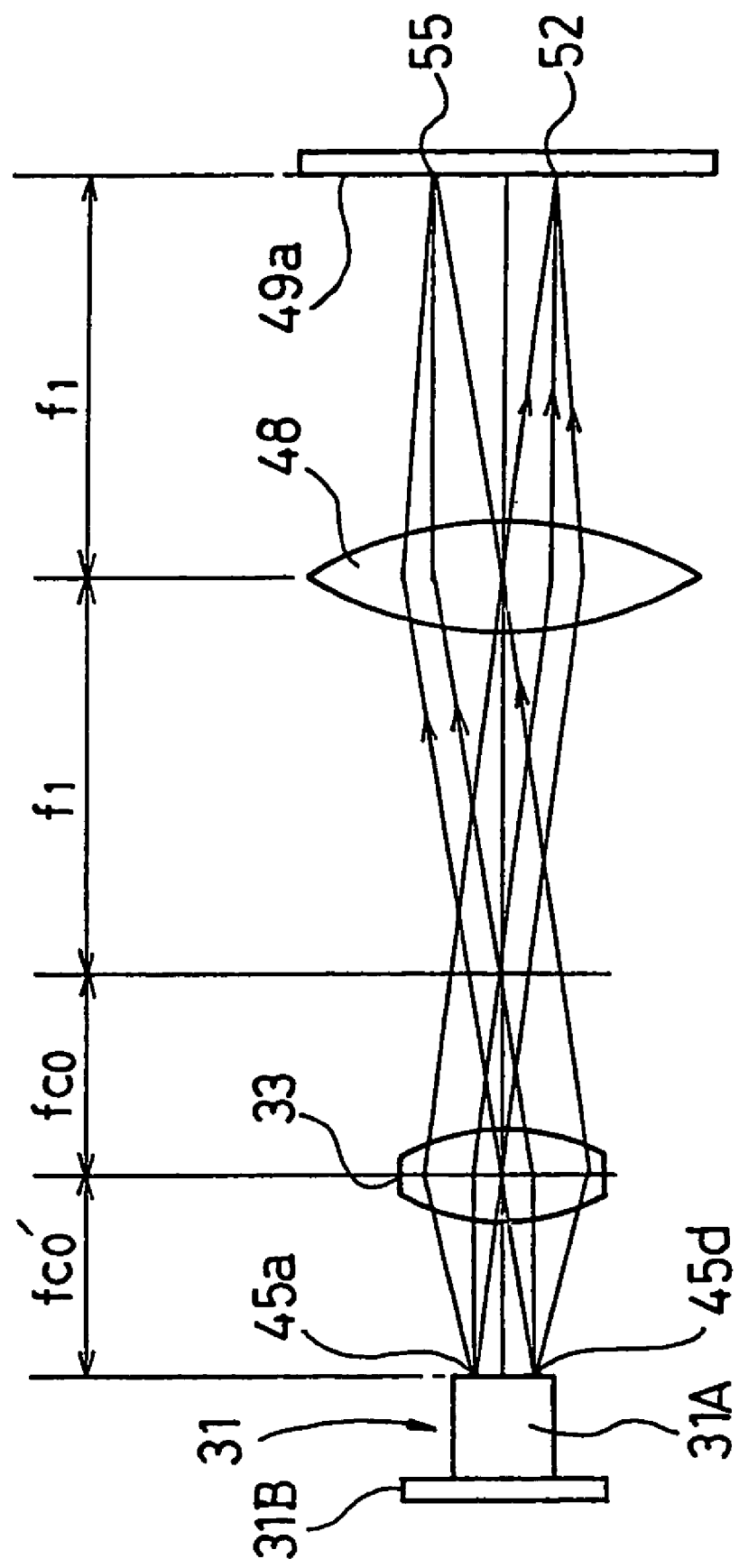
FIG. 21 is a schematic diagram of an optical system in the adjusting device shown in FIG. 16.

FIG. 21 illustrates an optical system of the adjusting device schematically. In the same figure, fco stands for a rear-side focal length of the collimator lens 33, fco' stands for a front-side focal length of the collimator lens 33, f1 stands for a front-side focal length of the condenser lens 48, and f1' stands for a rear-side focal length of the condenser lens 48.

An image pickup surface (an area type image receiving surface) 49a of the image pickup device 49 is positioned at the rear-side focal length f1 of the condenser lens 48. The front-side focal position of the condenser lens 48 is made substantially coincident with the rear-side focal position of the collimator lens 33.

With the optical system constructed as above, multi-laser beams emitted from the light emitting points 45a–45d of the multi-beam laser diode 31 are substantially collimated by the collimator lens 33 and are focused onto the image pickup surface 49a by the condenser lens 48 substantially on a larger scale. Thus, it becomes possible to measure the position of each beam spot with a high accuracy.

Figure 22:
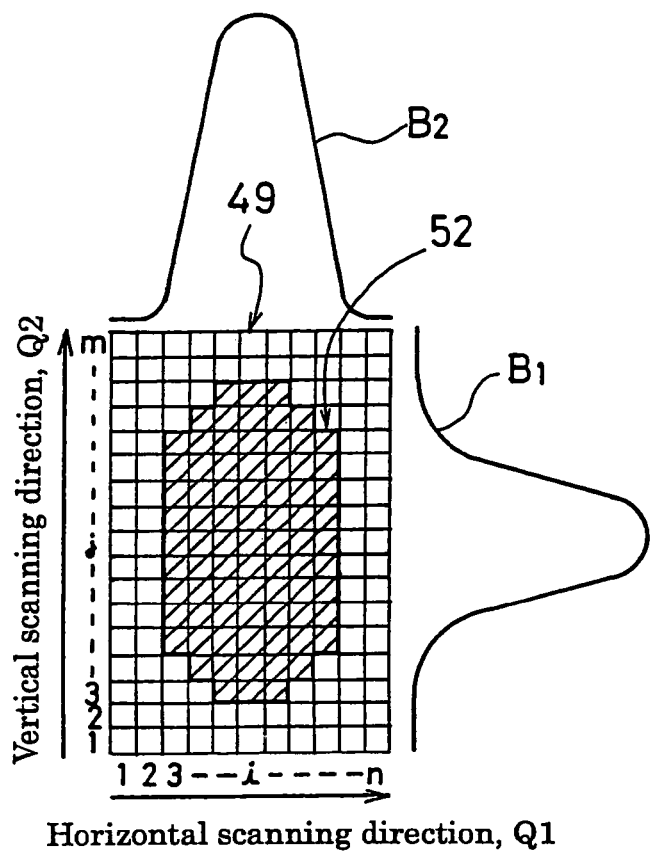
FIG. 22 is a schematic diagram showing an example of a beam spot formed on an image pickup surface shown in FIG. 16.

FIG. 22 is an enlarged view of the beam spot 52 formed on the image pickup surface 49a. The position of each beam spot is determined by calculating a centroid position. An example of how to calculate a centroid position of the beam spot 52 will be described below.

Each pixel of the image pickup surface 49a is defined by the reference mark Zij. The marks $Z1j, Z2j, \ldots Zij, \ldots, Znj$ stand for pixels arranged in the horizontal scanning direction Q1, while $Zi1, Zi2, \ldots, Zij, \ldots, Zim$ stand for pixels arranged in the vertical scanning direction Q2, and the mark i (integer from 1 to n) stands for the ith position counted from the left-hand side, while the mark j (integer from 1 to m) stands for the jth position counted from below.

If the sum total Wj ($Wj=Z1j+Z2j+\ldots+Zij+\ldots+Znj$) of output signals outputted from pixels $Z1j, Z2j, \ldots, Zij$ arranged in the horizontal scanning direction Q1 is obtained successively from j=1 to j=m in the vertical scanning direction Q2, there can be obtained a light beam intensity distribution curve B1 in the vertical scanning direction Q2. Likewise, if the sum total Wi ($Wi=Zi1+Zi2+Zij+\ldots+Zim$) of output signals outputted from pixels $Zi1, Zi2, \ldots, Zij, \ldots, Zim$ arranged in the vertical scanning direction Q2 is obtained successively from i=1 to i=n in the horizontal scanning direction Q1, there can be obtained a light beam intensity distribution curve B2 in the horizontal scanning direction Q1.

Figure 23:
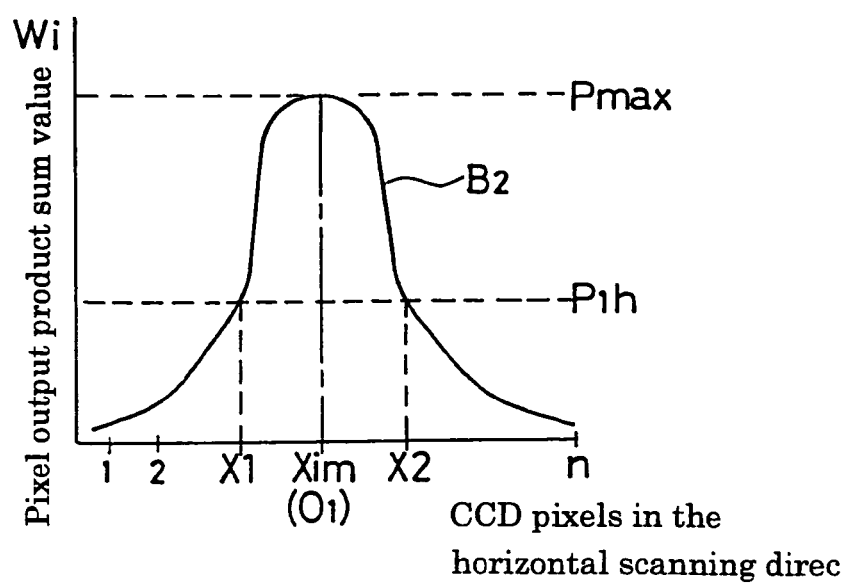
FIG. 23 is an explanatory diagram showing an example of determining a centroid position from a light beam distribution curve shown in FIG. 22.

In FIG. 23, a threshold value P1h is set for the beam intensity distribution curve B2, then addresses X1 and X2 of pixels in the horizontal scanning direction Q1 corresponding to the intensities which cross the threshold value P1h are specified, and an address Xim of the pixel corresponding to a mean value of the sum of the addresses X1 and X2 is obtained. In this way there is obtained a centroid position (central position) O1 in the horizontal scanning direction of the beam spot 52. By performing the same processing for the beam intensity distribution curve B1 there is obtained a centroid position (central position) in the vertical scanning direction. The threshold value P1h is set at one over the square of e (natural logarithm) from peak Pmax.

Thus, since the centroid position of the beam spot 52 is calculated on the basis of the entire shape of the beam spot focused on the image pickup surface 49a, it is desirable, for enhancing the calculation accuracy, to constitute an optical system so that the focusing area of each beam spot on the image pickup area 49a is ten times or more as large as the pixel area.

Figure 24:
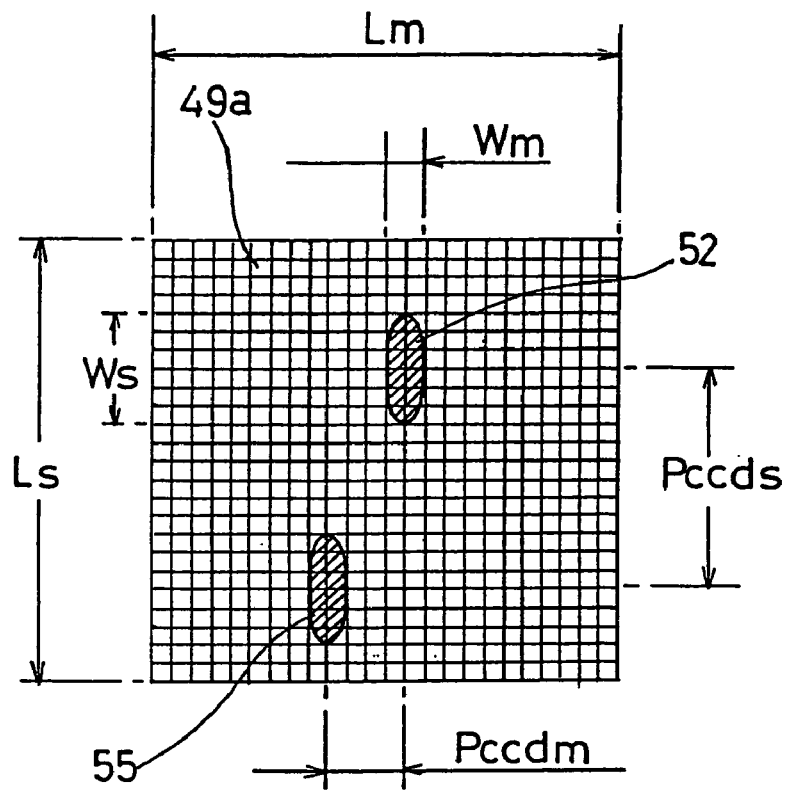
FIG. 24 is a schematic diagram for explaining a relation between a beam spot and the size of the image pickup surface.

More specifically, as shown in FIG. 24, given that the diameter in the horizontal scanning direction of the beam spot 52 on the image pickup surface 49a is Wm, the beam spot diameter in the vertical scanning direction on the image pickup surface 49a is Ws, the diameter in the horizontal scanning direction of the laser beam after passing the slit 36a is Dm', the beam diameter in the vertical scanning direction after passing the slit is Ds', and the oscillation wavelength of the multi-beam laser diode 31 is λ, the beam spot diameters Wm and Ws in the horizontal and vertical directions respectively are calculated in accordance with the following equations:

$$Wm=(f1\times\lambda)/(\pi\times Dm')$$

$$Ws=(f1\times\lambda)/(\pi\times Ds')$$

and the optical system in the adjusting device is designed so as to give:

$$\pi\times Wm\times Ws > \text{pixel area}\times 10$$

Further, if the pitch displacement quantity in the horizontal scanning direction between the remotest light emitting points 45a and 45d is PLDAm, the pitch displacement quantity in the vertical scanning direction between the light emitting points 45a and 45d is LDAs, the pitch in the horizontal scanning direction between the beam spot 52 from the light emitting point 45a and the beam spot 55 from the light emitting point 45d on the image pickup surface 49a is Pccdm, and the pitch in the vertical scanning direction between the beam spot 52 from the light emitting point 45a and the beam spot 55 from the light emitting point 45d on the image pickup surface 49a is Pccds, then a pitch displacement is calculated in accordance with the following equations Pccdm=(f1/fco)×PLDAm and Pccds=(f1/fco)×PLDAs and a magnification of the optical system is set so as to prevent protrusion of both beam spots 52 and 55 of the light emitting points 45a and 45d from the image pickup surface 49a and so as to satisfy the following relationships:

$$Pccdm\times(N-1)+Wm<Lm$$

$$Pccds\times(N-1)+Ws<Ls$$

where Lm stands for an overall length of the image pickup surface 49a in the horizontal direction (horizontal scanning direction), Ls stands for an overall length of the image pickup surface 49a in the vertical direction (vertical scanning direction), and N stands for the number of light emitting points (N=4).

So setting the magnification of the optical system is efficient because the evaluation of four light emitting points 45a–45d can be done simultaneously by a single image pickup device 49.

When the light emitting points 45a–45d are to be turned ON at a time, the following control is made so that the light emitting outputs of the light emitting points 45a–45d become substantially equal to one another. First, any one of the light emitting points 45a–45d is turned ON and the output of the image pickup device 49 based on that activated light emitting point is detected and is stored as a reference output P1.

Figure 25:
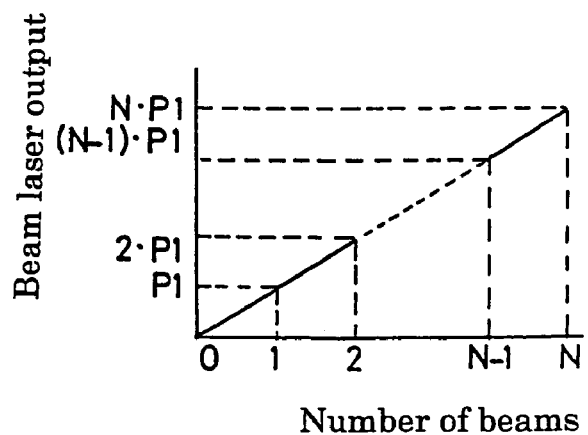
FIG. 25 is a diagram showing graphically an example of uniforming outputs of light emitting points.

Next, with the light emitting point thus turned ON left as it is, one of the remaining light emitting points is turned ON and a laser drive control circuit is adjusted so that the output of the image pickup device 49 becomes twice its reference output P1. This control adjustment is made successively for the four light emitting points 45a–45d and the laser drive control circuit is adjusted so as to afford an output four times the reference output P1. Generally, in the case where there are N number of light emitting points, the laser drive control circuit is set so as to give an output N times the reference output P1, as shown in FIG. 25.

By so setting the laser drive control circuit it is possible to make constant the intensity of each of the beam spots 52–55 on the image pickup sur face 49a and hence possible to accurately evaluate the position of each beam spot.

[Another Example of Calculating a Centroid Position of Each Beam Spot]

Figure 26:
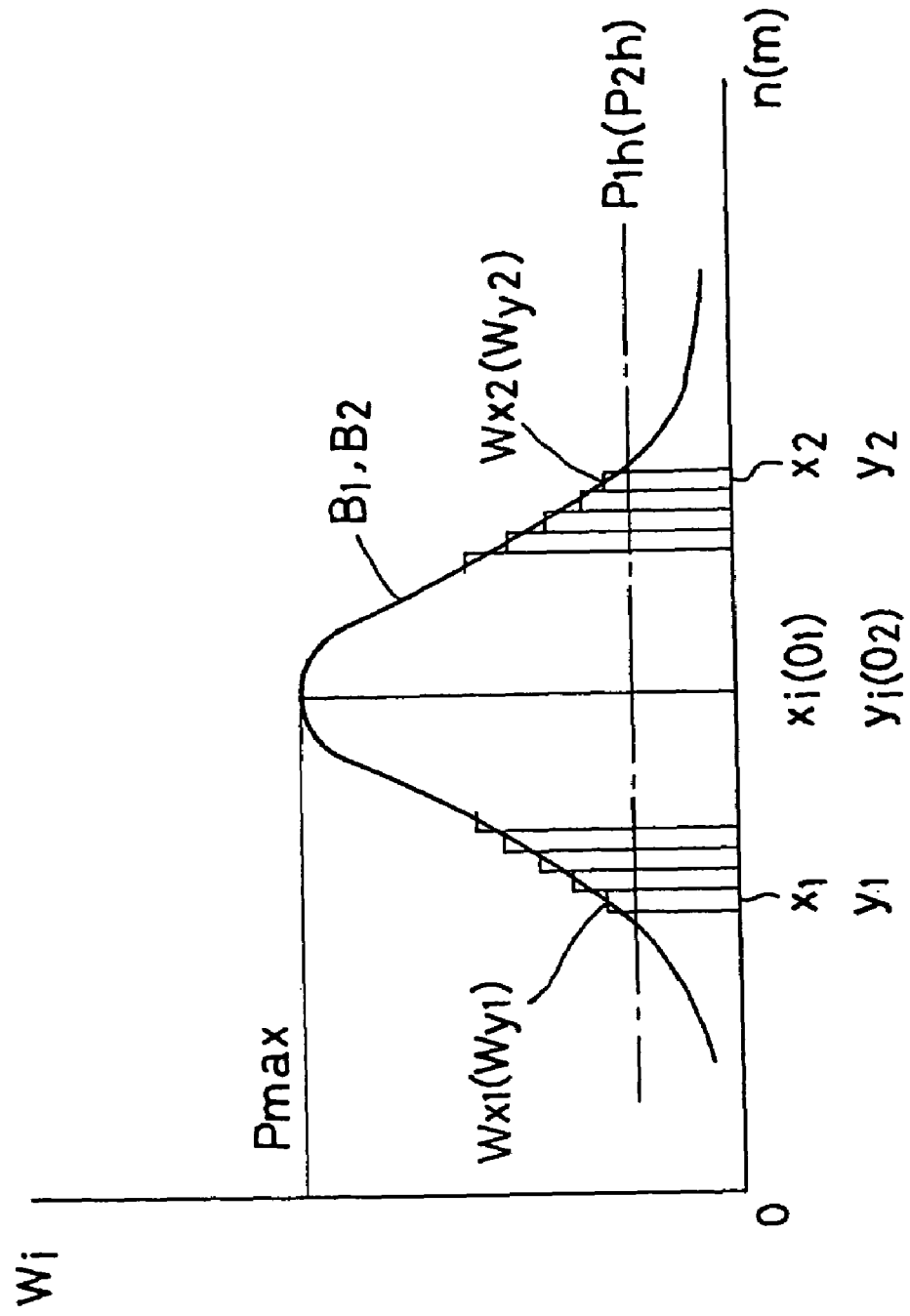
FIG. 26 is an explanatory diagram for explaining another example of a method for calculating a centroid position of a beam spot, showing a laser beam distribution curve.

In FIG. 26, given that a centroid position of a beam spot in the horizontal scanning direction is O1, a centroid position thereof in the vertical scanning direction is O2, the size of one pixel in the horizontal scanning direction is Gi, the size of one pixel in the vertical scanning direction is Gj, a threshold value obtained from the sum of products in the vertical scanning direction is P1h, and a threshold value obtained from the sum of products in the horizontal scanning direction is P2h, the centroid positions O1 and O2 may be determined in accordance with the following equations, in which the threshold values P1h and P2h are set to 1/e of the maximum value Pmax:

$$O_1 = G_i \times \frac{\sum_{i=x_1}^{x_2}\{(W_1 - P_{th})\times i\}}{\sum_{i=x_1}^{x_2}(W_1 - P_{1h})}$$

$$O_2 = G_j \times \frac{\sum_{j=y_1}^{y_2}\{(W_j - P_{2h})\times j\}}{\sum_{j=y_1}^{y_2}(W_j - P_{2h})}$$

According to this calculation method a central position of each beam spot can be determined with a high accuracy, particularly even when the beam spot is out of shape.

[Principal Construction of the Automatic Adjusting System]

Figure 27:
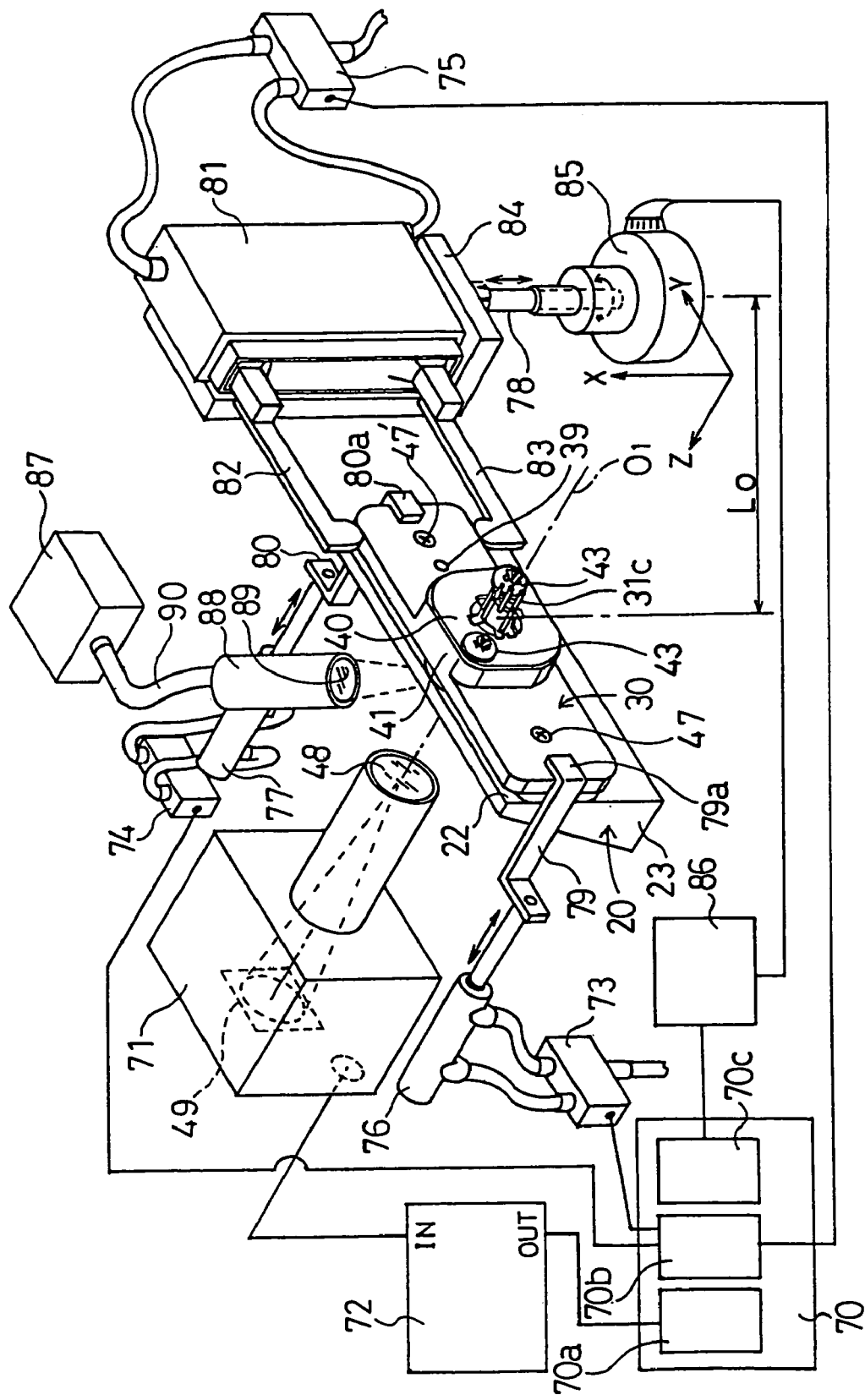
FIG. 27 is a diagram showing a principal construction of an automatic adjusting system for the multi-beam source unit according to the present invention.

FIG. 27 is a perspective view showing a principal construction of the automatic adjusting system. In the same figure, the numeral 70 denotes a control circuit (a personal computer for control) and numeral 71 denotes a CCD camera. The CCD camera 71 has the focusing lens 48 and a CCD as the image pickup device 49. The control circuit 70 has an image processing control section 70a, a mechanical drive section 70b, and a pulse motor control section 70c. An output signal from the CCD camera 71 is applied to a CCD camera drive unit 72 and is then inputted as an image signal to the image processing section via the CCD camera drive unit 72.

Mechanically, the automatic adjusting system is substantially composed of solenoid valves 73, 74 and 75, air cylinders 76 and 77, pressing arms 79 and 80, and an air chuck unit 81. The pressing arms 79 and 80 are respectively provided with pressing pieces 79a and 80a for pressing the base member 30 against the upright wall portion 22 of the mounting bracket 20. The air chuck unit 81 has gripping arms 82 and 83 to grip a side portion: of the base member 30 vertically. The air chuck unit 81 is fixed onto a support stand 84, which stand is actuated vertically by means of a pulse motor 85. A micrometer 78 is provided on the pulse motor 85 and the support stand 84 is mounted to an upper end of the micrometer 78.

In the construction of the micrometer shown in FIG. 16, the upper end thereof is in direct abutment against a side portion of the base member 30 from above, but it is to be understood that this is because the illustration of the micrometer in FIG. 16 is schematic.

Likewise, although a spatial layout relation between the base member 30 and the mounting bracket 20 is different between FIGS. 27 and 7, this is for the convenience of easily drawing an explanatory diagram of holding the base member 30 on the mounting bracket 20 through the pressing arms 79 and 80.

The mechanical drive section 70b outputs a valve ON-OFF signal to each of the solenoid valves 73, 74 and 75 and the air cylinders 76 and 77 are switched over from one to the other air feed direction, whereby the pressing arms 79 and 80 are switched over between a direction of pressing the base member 30 against the mounting bracket 20 and the opposite direction. Likewise, the supply of air for the air chuck unit 81 is switched over by the solenoid valve 75, whereby the gripping arms 82 and 83 are actuated between a direction in which the gripping arms grip side portions of the base member 30 vertically and a direction in which the side portions of the base member 30 are released from the gripped state.

The pulse motor control section 70c controls a pulse motor drive unit 86 and the pulse motor 85 is controlled by the pulse motor drive unit 86.

In the illustrated example an illuminating light source 87 and an illuminating lens barrel 88 are provided in the automatic adjusting system. The illuminating lens barrel 88 is provided with an illuminating lens 89. Illuminating light from the illuminating light source 87 is conducted to the illuminating lens 89 through an optical fiber 90. The illuminating lens 89 converges the illuminating light to illuminate the light emitting chip portion 45.

There may be adopted an adjusting method wherein a reflected image of the light emitting chip portion 45 resulting from reflection by the illuminating light of the light emitting chip portion 45 is received by the CCD camera 71 and the adjustment of rotation for the mounting bracket 20 of the base member 30 is performed by calculating an inclination of an edge image (to be described later) of the light emitting chip portion 45. A description will be given later about the procedure of this adjustment. Here, reference will be made first to the procedure for making adjustment of rotation by making the light emitting points 45a–45d emit light.

Figure 28:
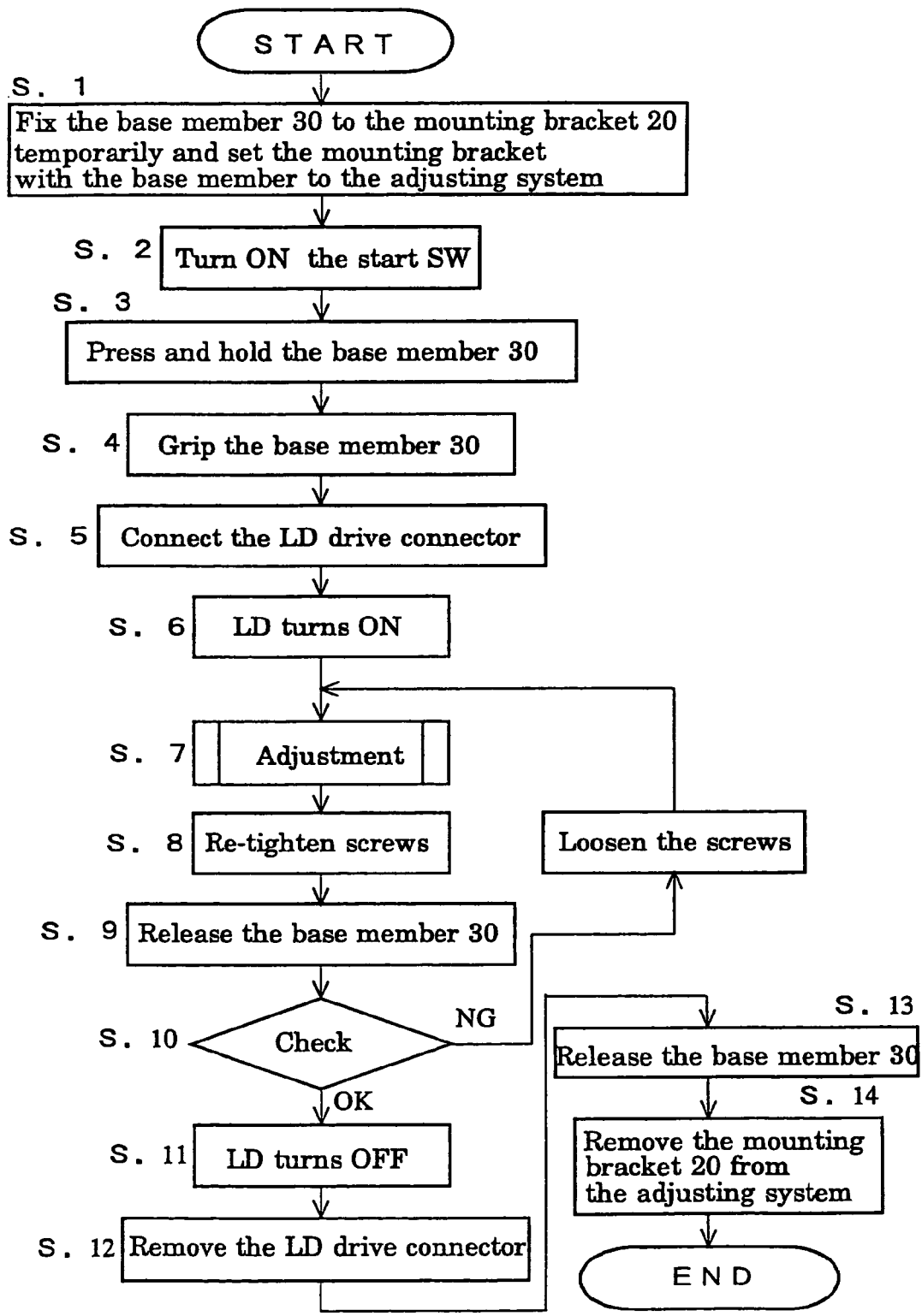
FIG. 28 is a flow chart explaining an adjusting process in the automatic adjusting system shown in FIG. 27.
Figure 29:
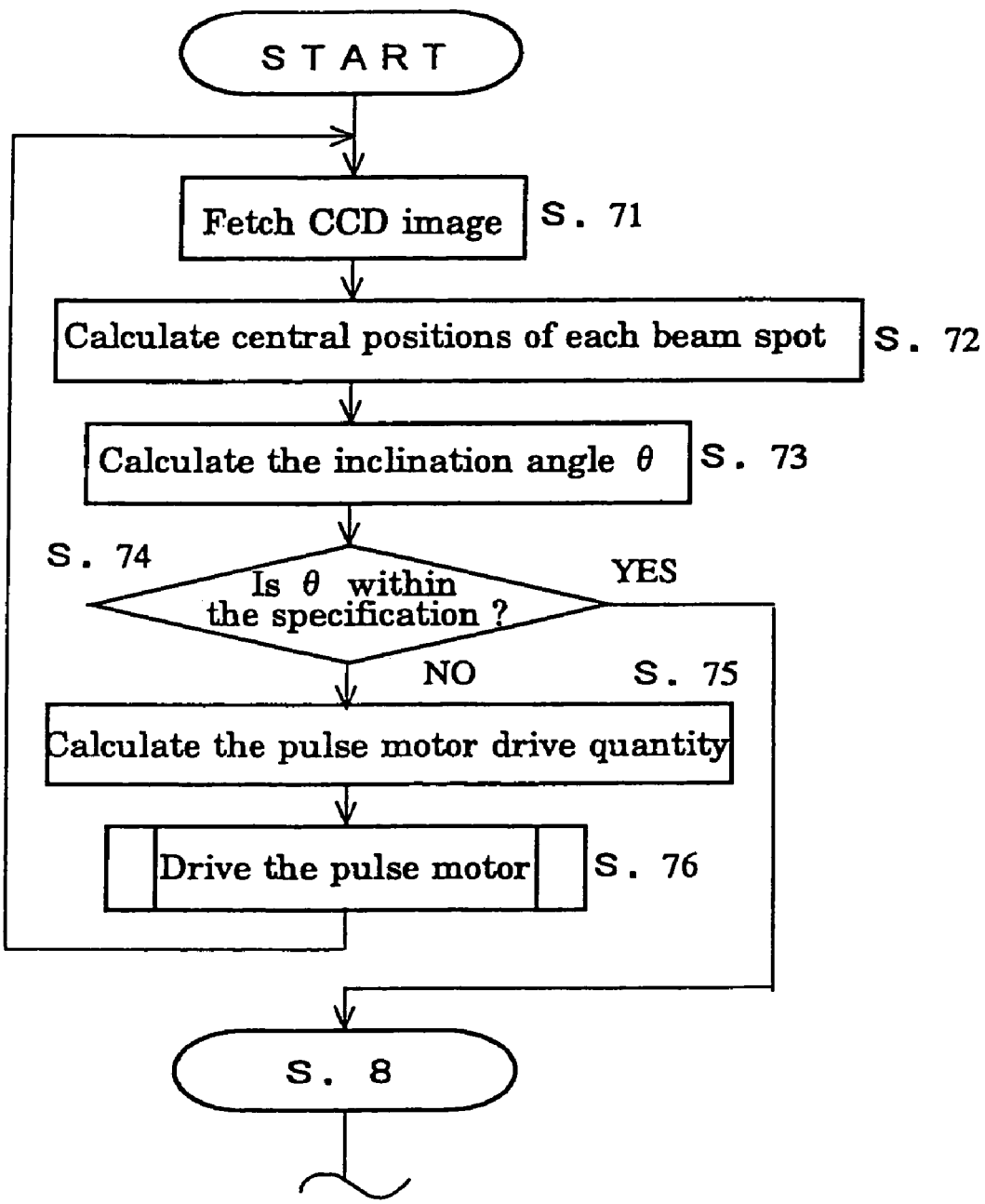
FIG. 29 is a flow chart explaining a detailed procedure of the adjusting process shown in FIG. 28.

FIGS. 28 and 29 are explanatory views of the said rotation adjusting procedure.

As shown in FIG. 28, the base member 30 is fixed temporarily to the mounting brackets 20 with screws 47' and the mounting bracket 20 is set to the adjusting system (S. 1). Next, a start switch (not shown) is turned ON (S. 2), whereby the air cylinders 76 and 77 are actuated and the base member 30 is pressed to the mounting bracket 20 and is held thereby (S. 3). Then, the base member 30 is gripped by the gripping arms 82 and 83 (S. 4). Next, a laser drive connector (not shown) is connected to each terminal 31C of the laser diode 31 (S. 5). The laser drive connector may be connected to each terminal 31C automatically with use of an air cylinder (not shown). As a result, the light emitting points 45a–45d are turned ON (S. 6).

Upon turning ON of the light emitting points 45a–45d, a shift is made to the procedure for adjustment processing shown in FIG. 29 (S. 7).

As shown in FIG. 29, a CCD image is fetched upon turning ON of the light emitting points 45a–45d (S. 71). More specifically, a CCD image is introduced into the image processing control section 70a and central positions O1 and O2 of each beam spot are calculated (S. 72). It is optional whether the central positions O1 and O2 are to be calculated in accordance with the centroid position calculating method described above with reference to FIG. 22 or by the centroid position calculating method described above with reference to FIG. 26. Next, an inclination angle θ relative to the virtual straight line Q3 in the arrangement direction Q4 is calculated (S. 73). For this calculation of the inclination angle there may be adopted any of the methods described previously.

Then, it is judged whether the inclination angle θ is within the specification or not (S. 74). If the answer is affirmative, the adjustment is ended and the processing flow shifts to step S. 8, in which the screws 47' are re-tightened and the base member 30 is fixed to the mounting bracket 20. It is optional whether this operation is to be done automatically or manually.

Unless the inclination angle θ falls under the specification, the image processing control section 70a calculates a rotation drive quantity of the pulse motor on the basis of for example, the distance LO from a rotational center O1' to a central axis of the micrometer 78 and the inclination angle θ. The data on the rotation drive quantity of the pulse motor is sent to the pulse motor control section 70c, whereby the pulse motor drive unit 86 is controlled and the pulse motor 85 is rotated by the rotation drive quantity to move the micrometer 78 up or down (S. 76).

With the vertical movement of the micrometer 78, the gripping arms 82 and 83 also move vertically, whereby the base member 30 is rotated about the rotational center O1'.

Then, the processing flow shifts to S. 71 and the processings of S. 71 to S. 74 are repeated. If the inclination angle θ falls under the specification, the flow shifts to S. 8, while if the inclination angle θ is still outside the specification, the processings after S. 75 are repeated.

When the fixing of the base member 30 to the mounting bracket 20 is completed by re-tightening the screws 47' in S. 8, the base member 30 is released from the gripping arms 82 and 83 (S. 9).

Thereafter, a check is made to see if the inclination angle θ is within the specification or not (S. 10) and if the answer is negative, the screws 47' are loosened, the flow again shifts to S. 7 and the processings of S. 7 to S. 10 are repeated.

If the inclination angle θ is found to be within the specification in S. 10, the flow shifts to S. 11 to turn OFF the light emitting points 45a–45d and thereafter the laser drive connector is removed from each terminal 31c (S. 12). Subsequently, the base member 30 is released from the mounting bracket 20 (S. 13), followed by removal of the mounting bracket 20 from the adjusting system (S. 14).

Figure 30:
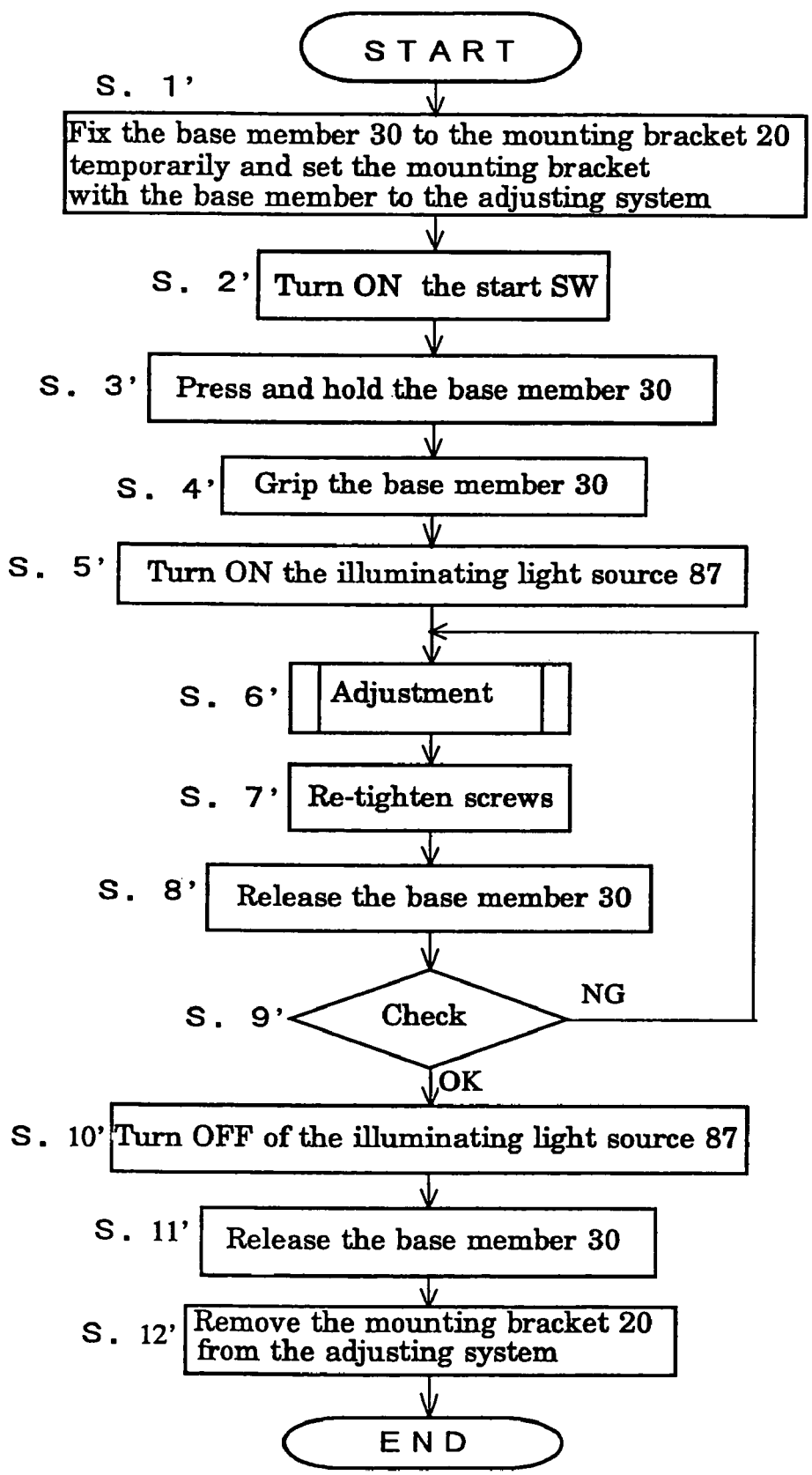
FIG. 30 is a flow chart explaining another adjusting process in the automatic adjusting system shown in FIG. 27.

FIGS. 30 and 31 are explanatory diagrams explaining the procedure of rotation adjustment for the base member 30 relative to the mounting bracket 20 which adjustment is based on an inclination measurement of an edge image of the light emitting chip portion 45.

Figure 32A:
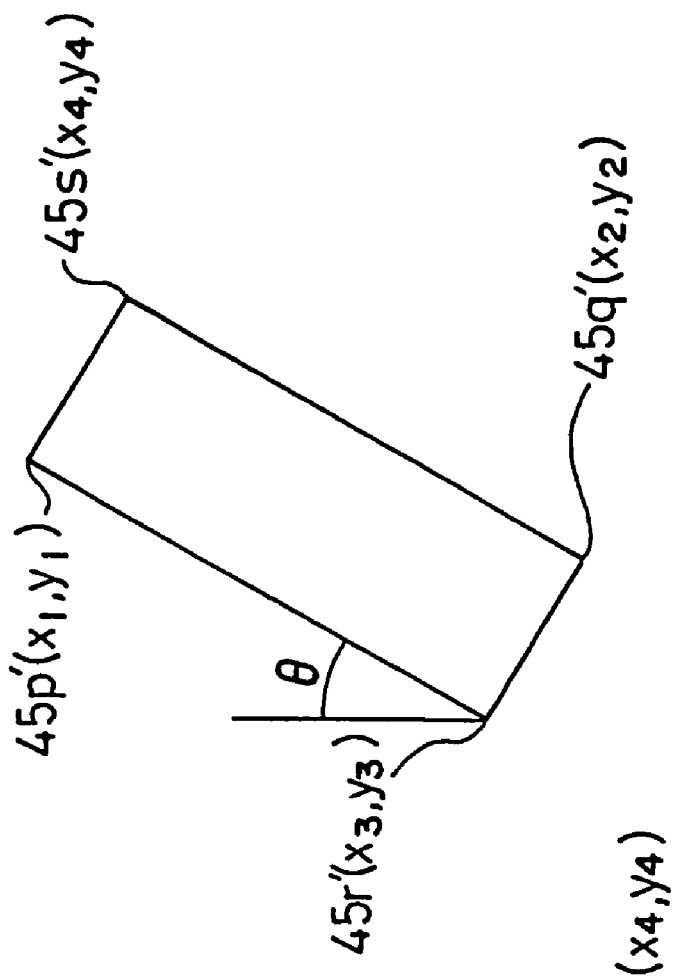
FIG. 32 is an explanatory diagram of an edge image obtained by lighting of an illuminating light source, in which (a) shows a case where the edge image is inclined leftwards with respect to a standard design line and (b) shows a case where the edge image is inclined rightwards with respect to the standard design line.
Figure 32B:
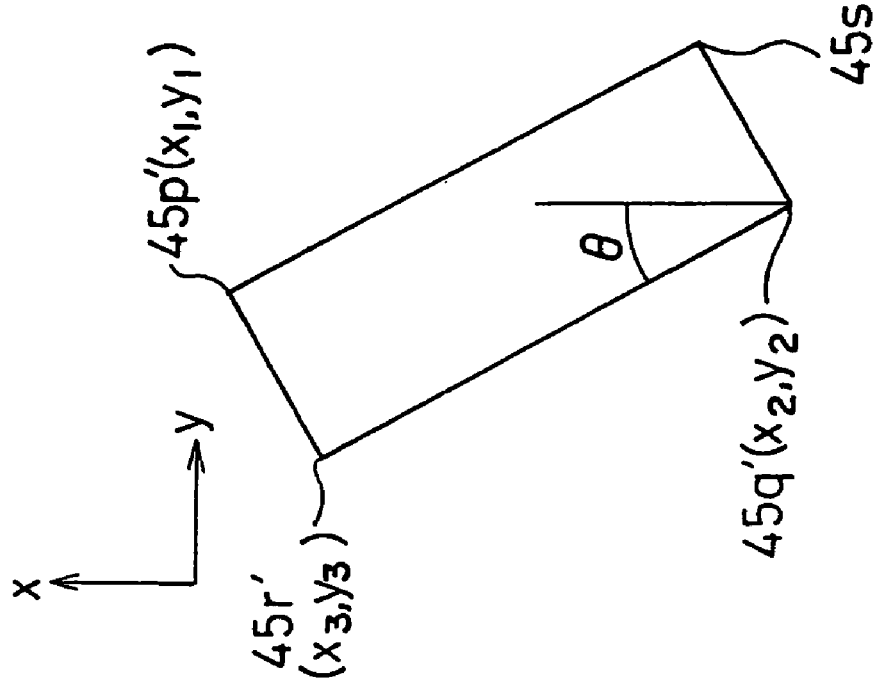

As shown in FIG. 30, the base member 30 is fixed temporarily to the mounting bracket 20 with screws 47' and the mounting bracket 20 with base member 30 is set to the adjusting system (S. 1'). Next, a start switch (not shown) is turned ON (S. 2'). Then, the base member 30 is pressed against the mounting bracket 20 (S. 3') and is gripped by the gripping arms 82 and 83 (S. 4'). Next, the illuminating light source 87 is turned ON (S. 5'). Images of the light emitting chip portion 45 shown in FIGS. 32(a) and (b) are received by the illuminating light source 87 (S. 6').

The image processing control section 70a fetches the image of the light emitting chip portion (S. 61'), then performs a binarization processing (S. 62') and subsequent edge detection (S. 63'). As a result, edge images 45p, 45q, 45r, and 45s of the light emitting chip portion 45 are highlighted. The inclination angle θ of the straight line Q4 is calculated on the basis of coordinate values (x1', y1'), (x2', y2'), (x3', y3'), and (x4', y4') of corner points 45p', 45q', 45r', and 45s' of the edge images 45p, 45q, 45r, and 45s, respectively, and in accordance with the following equations:

$$x3 > x4 \quad \theta = \tan^{-1}\left(\frac{y_3 - y_2}{x_3 - x_2}\right)$$

$$x3 > x4 \quad \theta = (-1)\times\tan^{-1}\left(\frac{y_1 - y_3}{x_1 - x_3}\right)$$

Next, a check is made to see if the inclination angle θ is within the specification or not (S. 65') and if the answer is affirmative, the adjustment is ended and the screws 47' are re-tightened (S. 7') to fix the base member 30 to the mounting bracket 20.

On the other hand, if the inclination angle θ does not fall under the specification, a rotation drive quantity of the pulse motor is calculated (S. 66') and the micromotor 78 is moved up or down by the rotation drive quantity of the pulse motor (S. 67').

As a result, the gripping arms 82 and 83 move vertically and the base member 30 is turned about the rotation center O1'. Next, the processing flow shifts to S. 61' and the processings of S. 61' to S. 65' are repeated. If the inclination angle θ falls under the specification in S. 65', the flow shifts to S. 7', while if the inclination angle θ is still outside the specification, the processing of S. 66' and subsequent processings are repeated.

After the fixing of the base member 30 to the mounting bracket 20 by re-tightening of the screws 47' in S. 7' is completed, the base member 30 is released from the gripping arms 82 and 83 (S. 8') and then a check is made to see if the inclination angle θ is within the specification or not (S. 9'). If the answer is negative in S. 9', the screws 47' are loosened and the processing flow again shifts to S. 6', followed by repetition of the processings S. 6' to S. 9'.

If the inclination angle θ is within the specification in S. 9', the flow shifts to S. 10' to turn OFF the illuminating light source 87 and thereafter the base member 30 is released from the mounting bracket 20 (S. 11'). Subsequently, the mounting bracket 20 is removed from the adjusting system (S. 12').

Although in the above rotation adjustment based on edge images the images are obtained using a CCD camera and the rotation adjustment is made automatically, there may be adopted a construction wherein the same adjustment is made visually.

[Adjusting the Mounting Position of the Multi-Beam Laser Diode with a Positioning Jig]

Figure 33:
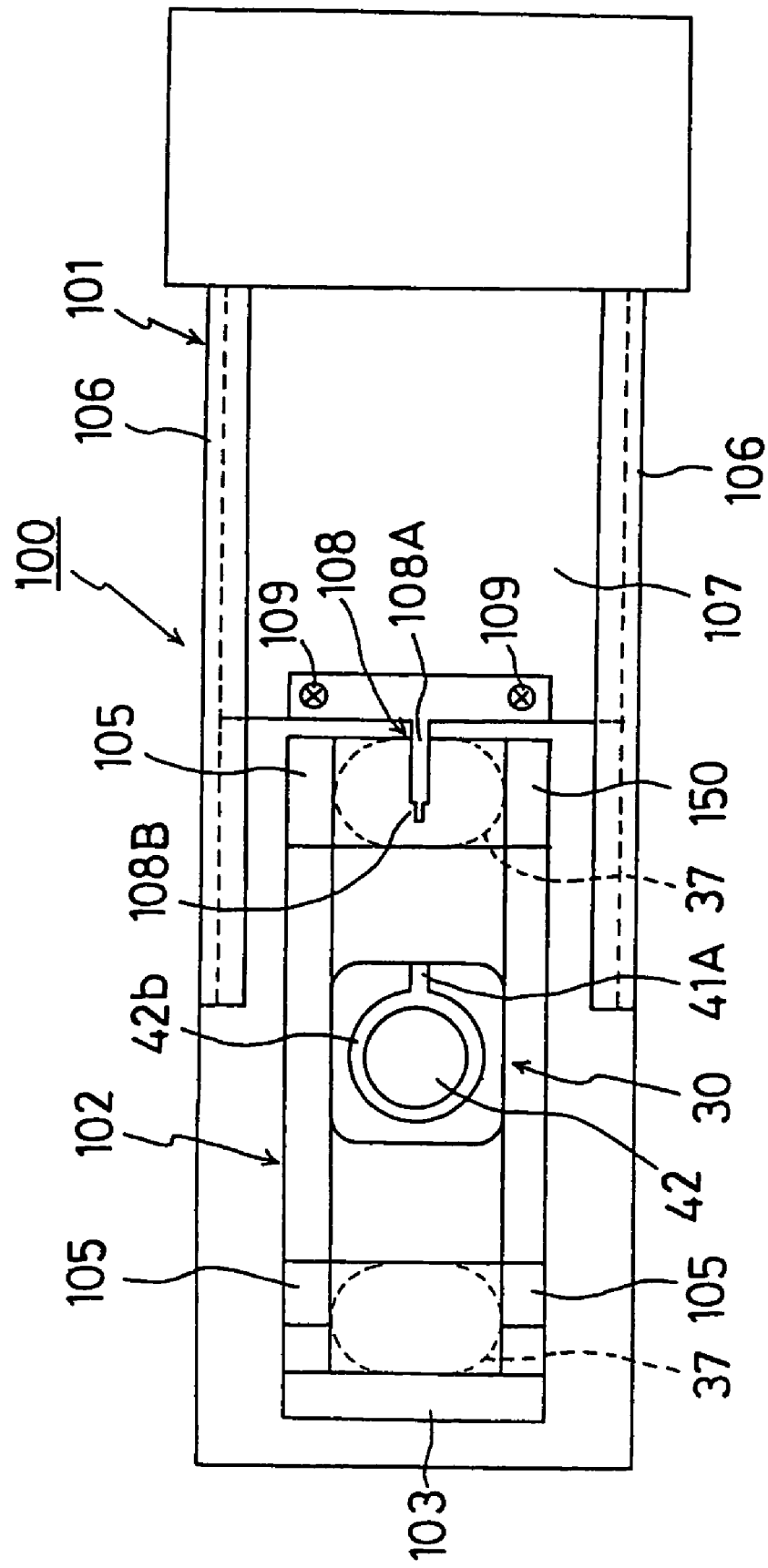
FIG. 33 is a plan view showing a schematic construction of a positioning jig, showing a mounted state of a base member before setting of a multi-beam laser diode.

FIG. 33 is a plan view of the positioning jig and FIG. 34 is an explanatory diagram explaining in what state positioning is effected using the positioning jig.

In FIG. 33, the numeral 100 denotes the positioning jig. The positioning jig 100 has a positioning jig body 101 and a base member rest portion 102. The base member rest portion 102 has a base member abutting portion 103, a base member rest surface 104, and a base member guide portion 105. The reference planes of the positioning reference portions 37 of the base member 30 are brought into abutment against the base member rest surface 104, one longitudinal end portion of the base member 30 is abutted against the base member abutting portion 103, and both side portions thereof perpendicular to the longitudinal direction are guided by base member guide portions 105 until the base member is placed on the base member rest portion 102.

A pair of guide rails 106 are disposed on the positioning jig body 101 and a slide member 107 is mounted sidably on the guide rails 106. A positioning member 108 is secured to the slide member 107 removably with screws 109. The positioning member 108 comprises a guide portion 108A which is guided by a positioning groove 41A and an engaging lug 108B for positioning which is formed at a free end of the guide portion 108A and which comes into close engagement with the cutout portion 47.

As shown in FIG. 34, the base member 30 is positioned and placed on the base member rest portion 102, the multi-beam laser diode 31 is inserted into the fitting cylinder 32, then the pressing plate 40 is put on the stem 31B of the multi-beam laser diode 31 and is fixed temporarily with screws 43.

Subsequently, the slide member 107 is allowed to slide toward the base member 30, with the result that the positioning member 108 is guided along the positioning groove 41A and the engaging lug 108B for positioning comes into engagement with the cutout portion 47. If the base member 30 and the multi-beam laser diode 31 are displaced from each other in the rotational direction, the engaging lug 108B for positioning abuts the peripheral wall of the cutout portion 47 as it advanced into the cutout portion, whereby the multi-beam laser diode 31 is rotated with respect to the base member 30 and is adjusted to a predetermined positional relation in the rotational direction with respect to the base member 30.

By re-tightening the screws 43 in this state the multi-beam laser diode 31 is pressed against the pressing plate mounting portion 41 by means of the pressing plate 40 and is fixed to the base member 30 unrotatably. If the slide member 107 is allowed to slide in the opposite direction in this fixed state of the diode, the cutout portion 47 and the engaging lug 108B for positioning are disengaged from each other.

In this way the multi-beam laser diode 31 and the base member 30 are rendered integral with each other and the base member 30 with the multi-beam laser diode is mounted to the mounting bracket 20 and is adjusted for rotation, as described earlier.

As set forth above, in the adjusting method for the multi-beam source unit according to the present invention, an arranged state of the light emitting points relative to the standard design line is measured on the basis of beam spots on the image surface corresponding to the image recording surface and the multi-beam laser diode is rotated for adjustment around the optical axis of the optical system. Consequently, the arranged direction of the light emitting points can be aligned with the standard design line direction easily.

Particularly, if the arranged direction of the light emitting points is aligned with the vertical scanning direction in advance of the mounting of the multi-beam source unit to the body portion of the image forming apparatus, then the adjusting operation of adjusting the beam spot pitch in the vertical scanning direction after the mounting of the multi-beam source unit to the image forming apparatus body, a complicated construction such that, for correcting write start positions displaced in the horizontal scanning direction by the beam spot pitch adjustment, a sensor for detecting the scanning position of each laser beam is provided for each laser beam in the image forming apparatus body and a write start position is controlled for each laser beam, and a complicated construction such that a time delay in the horizontal scanning direction of each laser beam is measured and a laser beam drive control is performed using a delay circuit, can all be avoided and hence it is possible to reduce the number of components used and also possible to shorten the assembling time required for the mounting to the image forming apparatus body, with consequent attainment of the reduction of cost. The simplification of control using software can also be attained.

In the multi-beam source unit adjusting device according to the present invention, since multi-laser beams from all the light emitting points can be enlarged and substantially condensed and focused onto an image pickup surface, it is possible to detect beam spot positions with a high accuracy.

In the multi-beam source unit assembling method according to the present invention, both adjustment in the arranged direction of beam spots and positional adjustment of the collimator lens can be done simultaneously in the multi-beam source unit assembling process and thus the multi-beam source unit assembling work can be done efficiently.

In the image forming apparatus according to the present invention, at the time of mounting the adjusted multi-beam source unit to the body portion of the image forming apparatus, it is possible to simplify the position adjusting work for the scanning optical system.

What is claimed is:

1. A method for adjusting a multi-beam source unit including a multi-beam laser diode including a stem having a pair of cutout portions configured to define a virtual straight line and a plurality of light emitting points positioned substantially in a straight line with respect to each other and configured to radiate laser beams, and a collimator lens configured to collimate the laser beams, the multi-beam source unit configured to be set to a scanning optical system assuming that when the position of the plurality of light emitting points coincides with the virtual straight line, the position of the plurality of light emitting points coincides with a predetermined standard design line, the method comprising:

measuring a state of the position of the plurality of light emitting points with respect to the predetermined standard design line based on beam spots corresponding to the plurality of light emitting points on an image recording surface; and rotating the multi-beam laser diode about an optical axis of the scanning optical system to align the position of the plurality of light emitting points with the predetermined standard design line.

2. A method for adjusting a multi-beam source unit according to claim 1, wherein the virtual straight line is defined by a concave or convex portion as an engaging portion formed in the stem.

3. A method for adjusting a multi-beam source unit according to claim 1, wherein the measuring includes:

determining the state of the position of the plurality of light emitting points with respect to the predetermined standard design line based on a line defined by joining two beam spots corresponding to two of the plurality of light emitting points that are farthest from each other.

4. A method for adjusting a multi-beam source unit according to claim 1, wherein the measuring includes:

measuring relative positions of the beam spots to determine an approximate straight line on which the position of the plurality of light emitting points coincides; and determining the state of the position of the plurality of light emitting points based on the approximate straight line.

5. A method for adjusting a multi-beam source unit according to claim 4, wherein the measuring includes:

determining the approximate straight line by using a method of least squares.

6. A method for adjusting a multi-beam source unit according to claim 1, wherein the measuring includes:

executing repeatedly an operation including measuring relative positions of the beam spots in a horizontal scanning direction based on relative angle positions with respect to the predetermined standard design line to determine a maximum deviation in the horizontal scanning direction among the beam spots; and rotating the multi-beam laser diode to measure the relative positions of the beam spots in the horizontal scanning direction at different relative angle positions; and determining the state of the position of the plurality of light emitting points based on a relative angle position corresponding to the smallest maximum deviation.

7. A method for adjusting a multi-beam source unit according to claim 1, wherein the state of the position of the plurality of light emitting points is substantially parallel to the predetermined standard design line.

8. A method for adjusting a multi-beam source unit according to claim 1, wherein the multi-beam source unit includes a base member having a fitting cylinder configured to define a rotational center thereof, said base member rotatably supporting the multi-beam laser diode; a mounting bracket configured to be mounted to a body portion of an image forming apparatus, the mounting bracket having a plane configured to be confronted with a plane formed in the body portion of the image forming apparatus, and a fitting hole configured to be fitted on the fitting cylinder; and an engaging piece configured to engage an engaging portion of the multi-beam laser diode and a pressing spring piece configured to press the stem, wherein the method further comprising:

engaging the engaging piece with the engaging portion; and wherein the rotating includes:

rotating the base member while supporting the base member by the mounting bracket to adjust the state of the position of the plurality of light emitting points to be substantially in parallel with the predetermined standard design line.

* * * * *